United States Patent [19]
Yokoyama et al.

[11] Patent Number: 6,066,521
[45] Date of Patent: May 23, 2000

[54] METHOD FOR MANUFACTURING BIMOS DEVICE WITH IMPROVEMENT OF HIGH FREQUENCY CHARACTERISTICS OF BIPOLAR TRANSISTOR

[75] Inventors: Hiroaki Yokoyama; Toshio Komuro, both of Tokyo, Japan

[73] Assignee: NEC Corporation, Tokyo, Japan

[21] Appl. No.: 09/256,173

[22] Filed: Feb. 24, 1999

Related U.S. Application Data

[62] Division of application No. 08/840,722, Apr. 25, 1997, Pat. No. 5,933,720.

[30] Foreign Application Priority Data

Apr. 25, 1996 [JP] Japan .................................. 8-105257

[51] Int. Cl.⁷ .............................................. H01L 21/8238
[52] U.S. Cl. ........................................ 438/202; 438/216
[58] Field of Search ................................... 438/202, 216, 438/217, 225

[56] References Cited

U.S. PATENT DOCUMENTS

| | | | |
|---|---|---|---|
| 3,775,192 | 11/1973 | Beale | 148/DIG. 106 |
| 4,313,255 | 2/1982 | Shinozaki et al. | 438/345 |
| 4,839,302 | 6/1989 | Kameyama et al. | 148/DIG. 10 |
| 4,968,635 | 11/1990 | Hamasaki | 438/341 |
| 5,254,485 | 10/1993 | Segawa et al. | 438/370 |
| 5,319,234 | 6/1994 | Uga et al. | 257/369 |
| 5,376,562 | 12/1994 | Fitch et al. | 438/155 |

FOREIGN PATENT DOCUMENTS

| | | |
|---|---|---|
| 2-226759 | 9/1990 | Japan . |
| 2-253655 | 10/1990 | Japan . |
| 3-136274 | 6/1991 | Japan . |
| 4-346263 | 12/1992 | Japan . |

OTHER PUBLICATIONS

Stanley Wolf Ph.D. and Richard N. Tauber Ph.D. in Silicon Processing for the VLSI Era, vol. 1: Process Technology, Lattice Press, 1986. p. 265.

*Primary Examiner*—Charles Bowers
*Assistant Examiner*—William M. Brewster
*Attorney, Agent, or Firm*—Whitham, Curtis & Whitham

[57] ABSTRACT

In a method for manufacturing a BiMOS device, first and second semiconductor layers are formed on a semiconductor substrate, first and second field insulating layers are formed by using a LOCOS process on said first and second semiconductor layers, respectively. The first field insulating layer partitions a bipolar transistor area and a MOS transistor area, and the second field insulating layer is formed on a base-emitter junction region of the first semiconductor layer. Then, impurities are introduced via the second field insulating layer into the first semiconductor layer to form a base region therein. Then, an emitter opening is perforated in the second field insulating layer, and a polycrystalline silicon layer is formed on the second field insulating layer. Then, impurities of a first conductivity type are introduced into the polycrystalline silicon layer, and a heating operation is performed upon the polycrystalline silicon layer to form an emitter region. Then, the polycrystalline silicon layer is patterned to form an emitter electrode. Then, a gate insulating layer is formed on the second semiconductor layer, and a gate electrode is formed on the gate insulating layer. Finally, a base graft region is formed type in the first semiconductor layer and source/drain regions are formed in the second semiconductor layer.

3 Claims, 22 Drawing Sheets

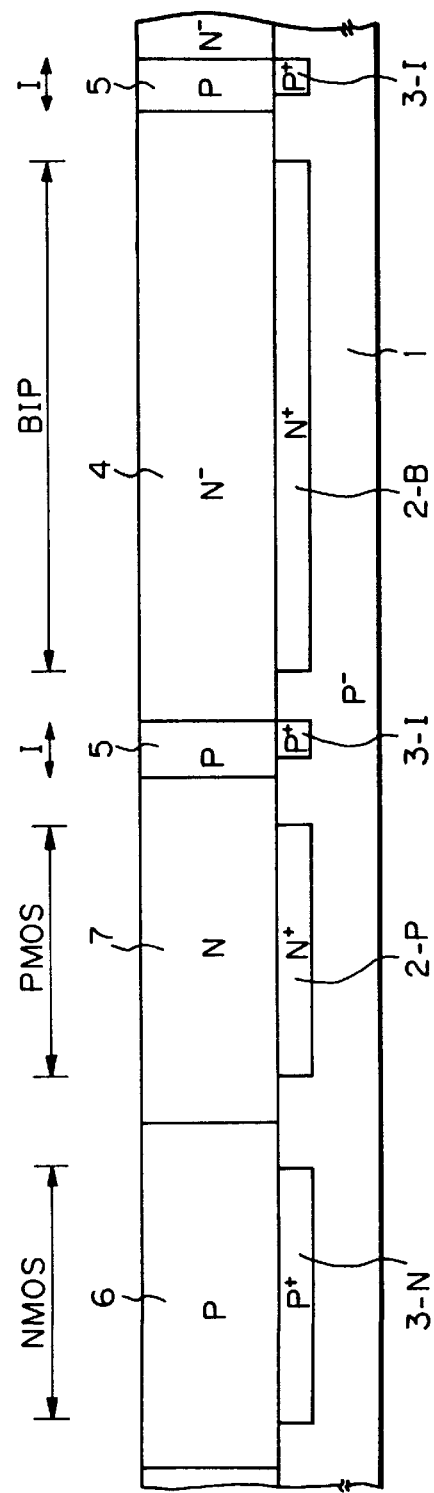
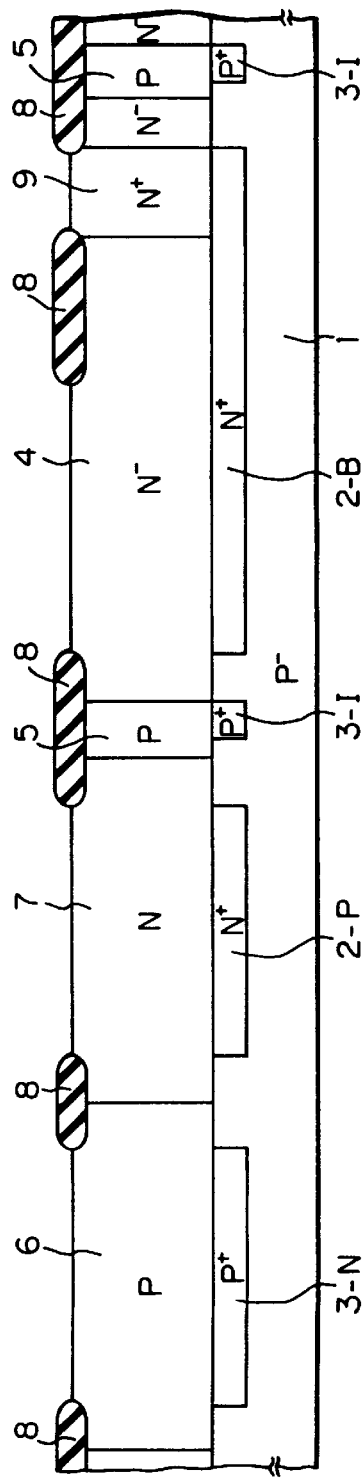
Fig. 1A PRIOR ART
Fig. 1B PRIOR ART

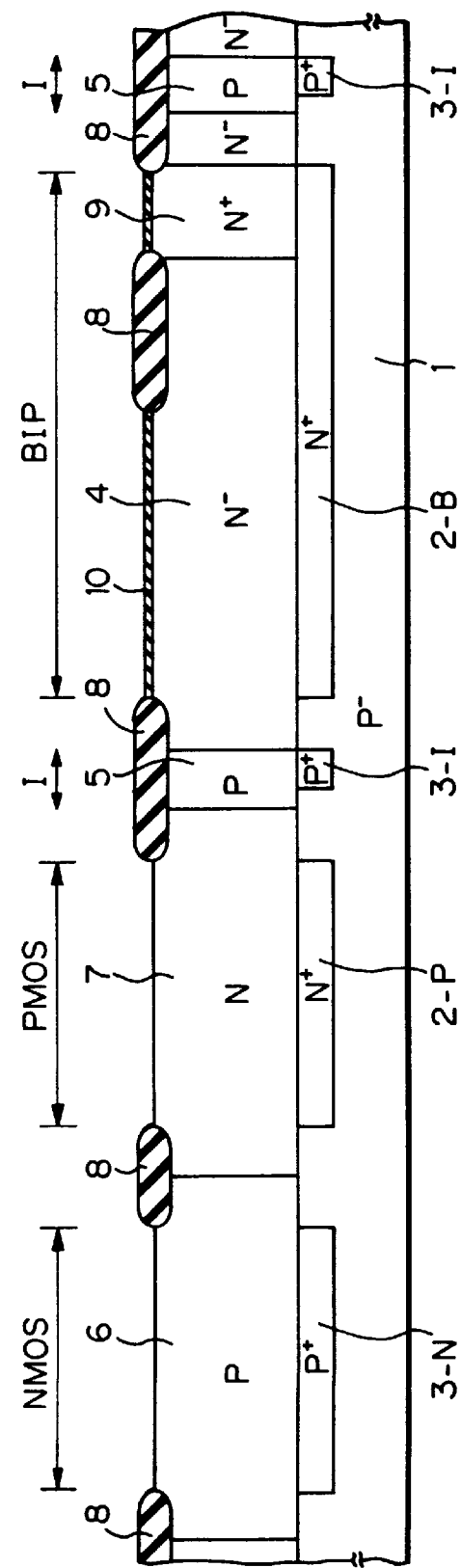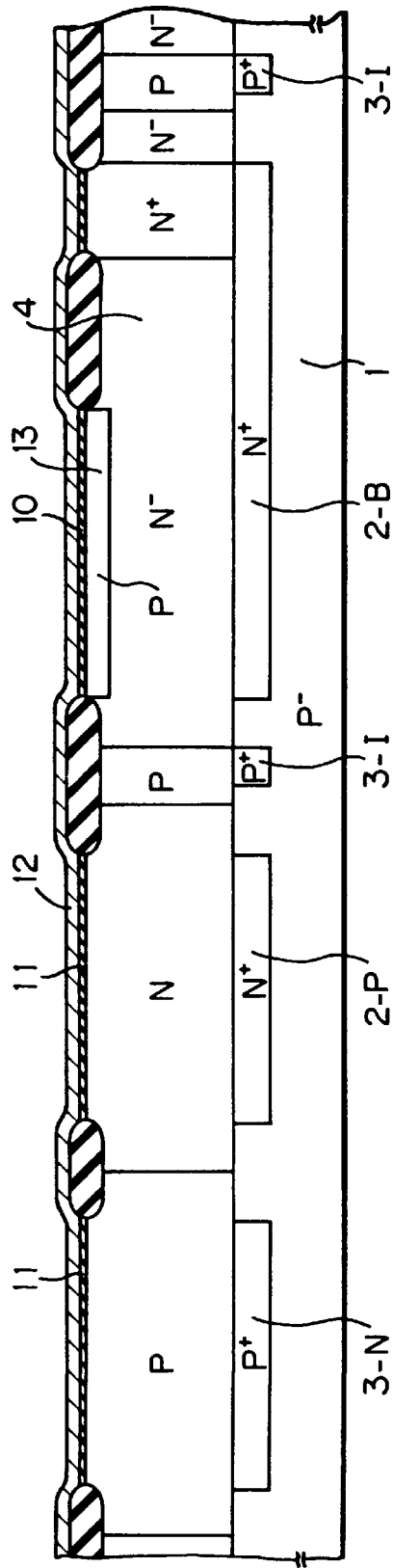
Fig. 1C PRIOR ART
Fig. 1D PRIOR ART

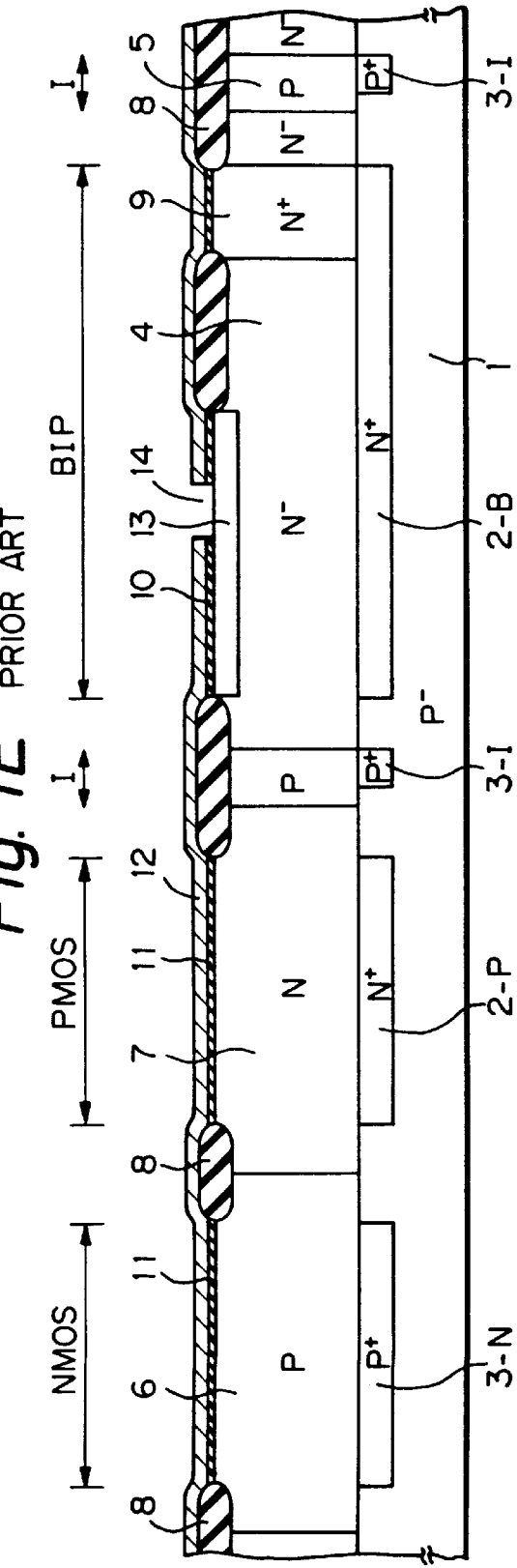
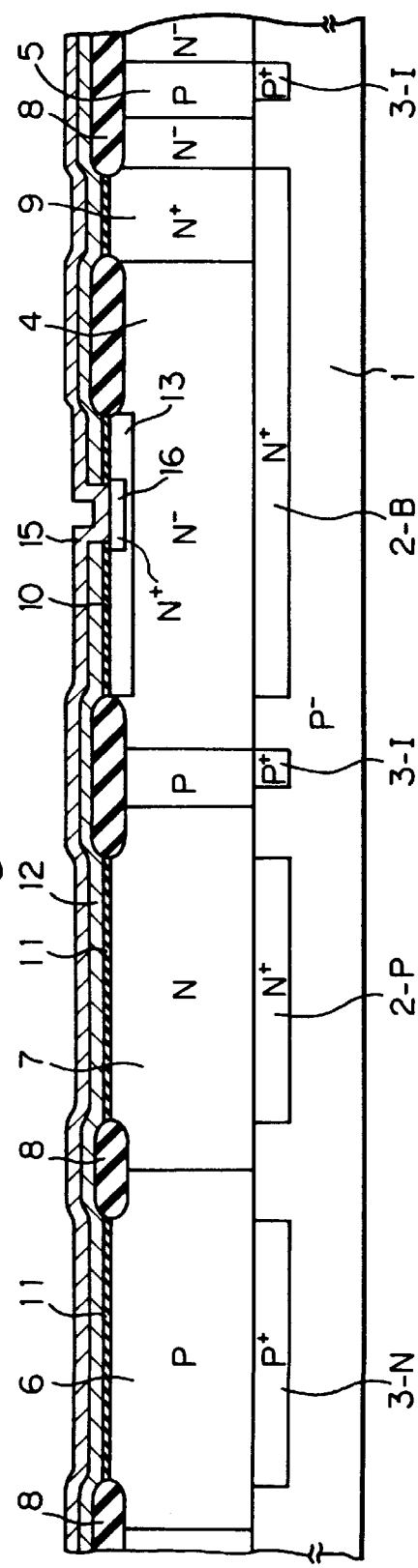
Fig. 1E PRIOR ART
Fig. 1F PRIOR ART

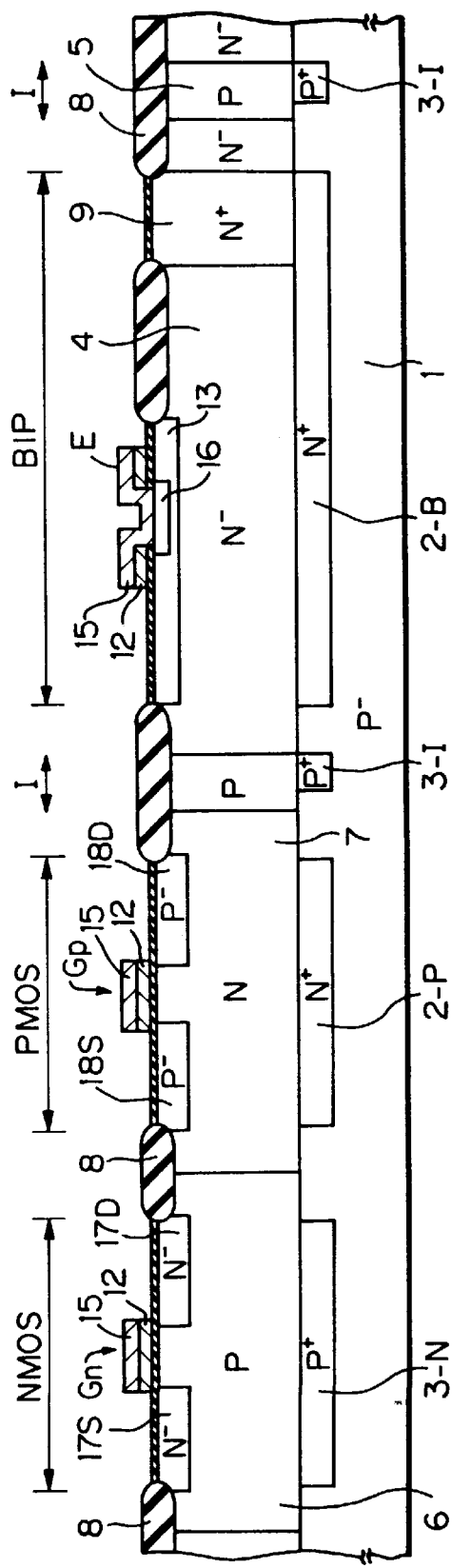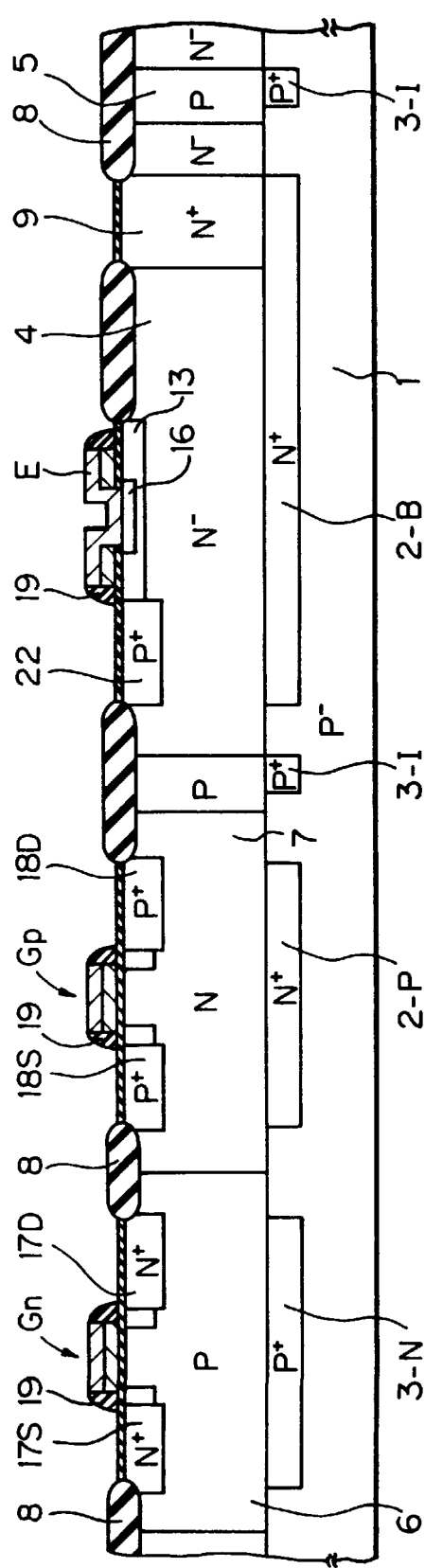
Fig. 1G PRIOR ART
Fig. 1H PRIOR ART

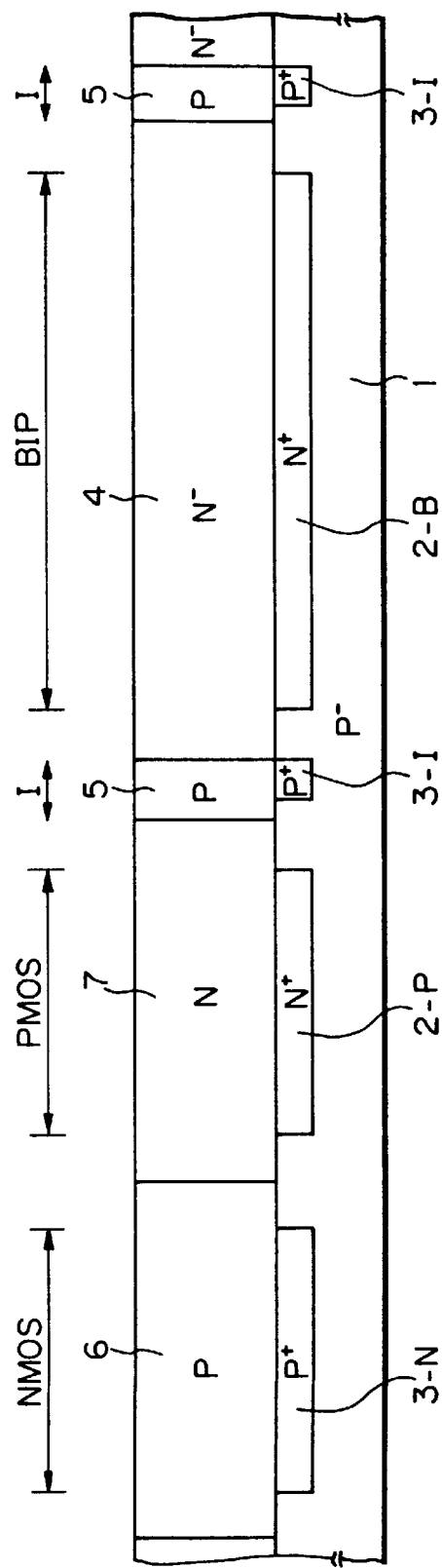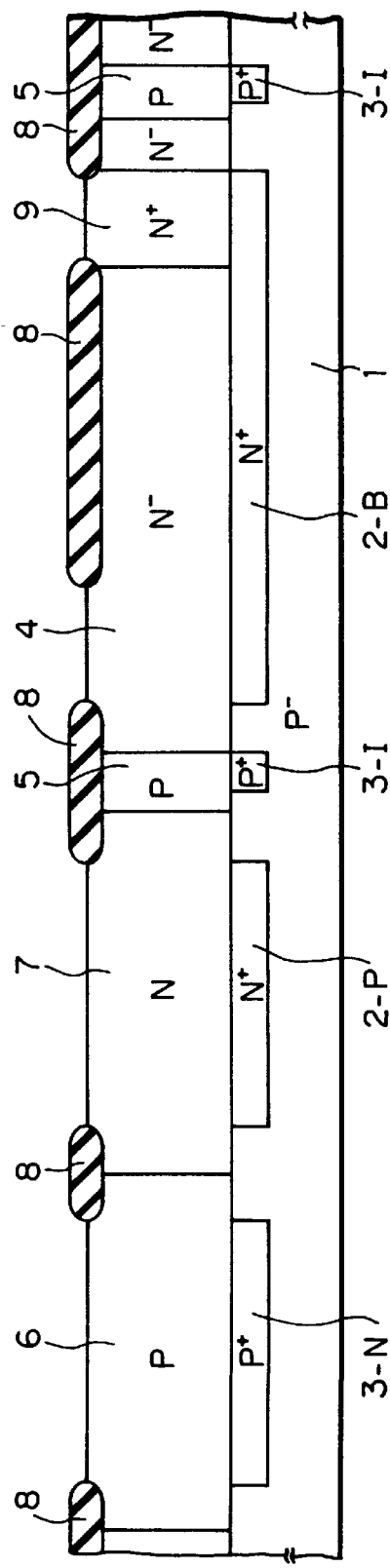

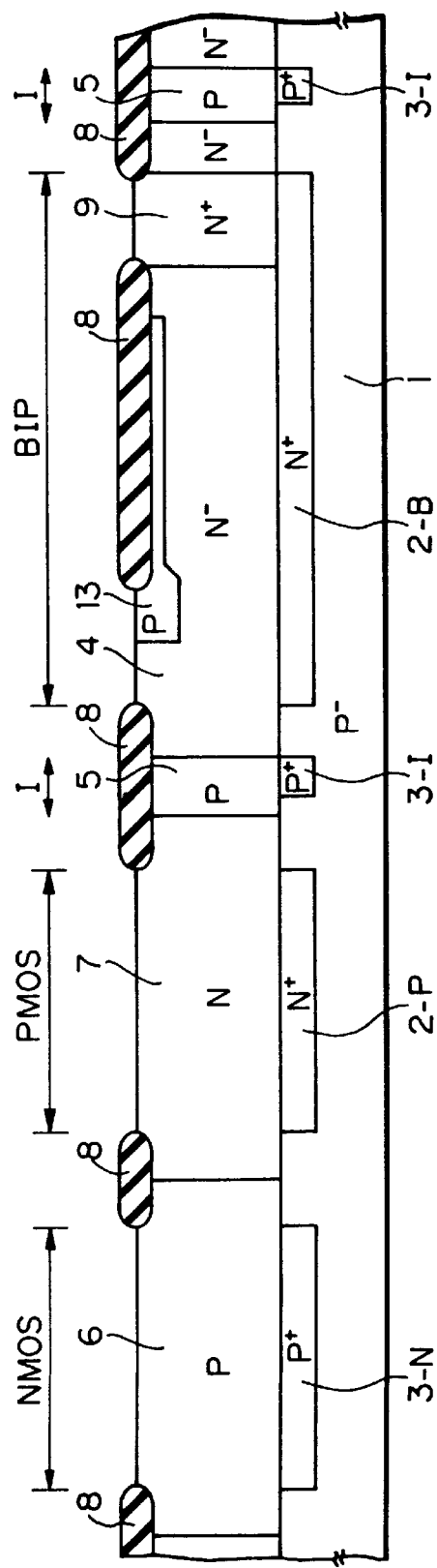
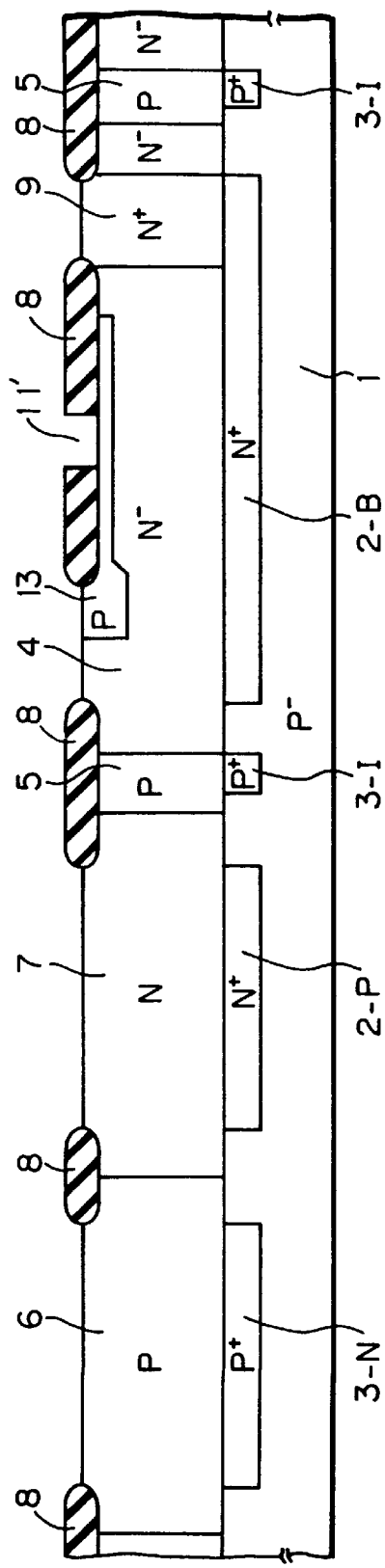

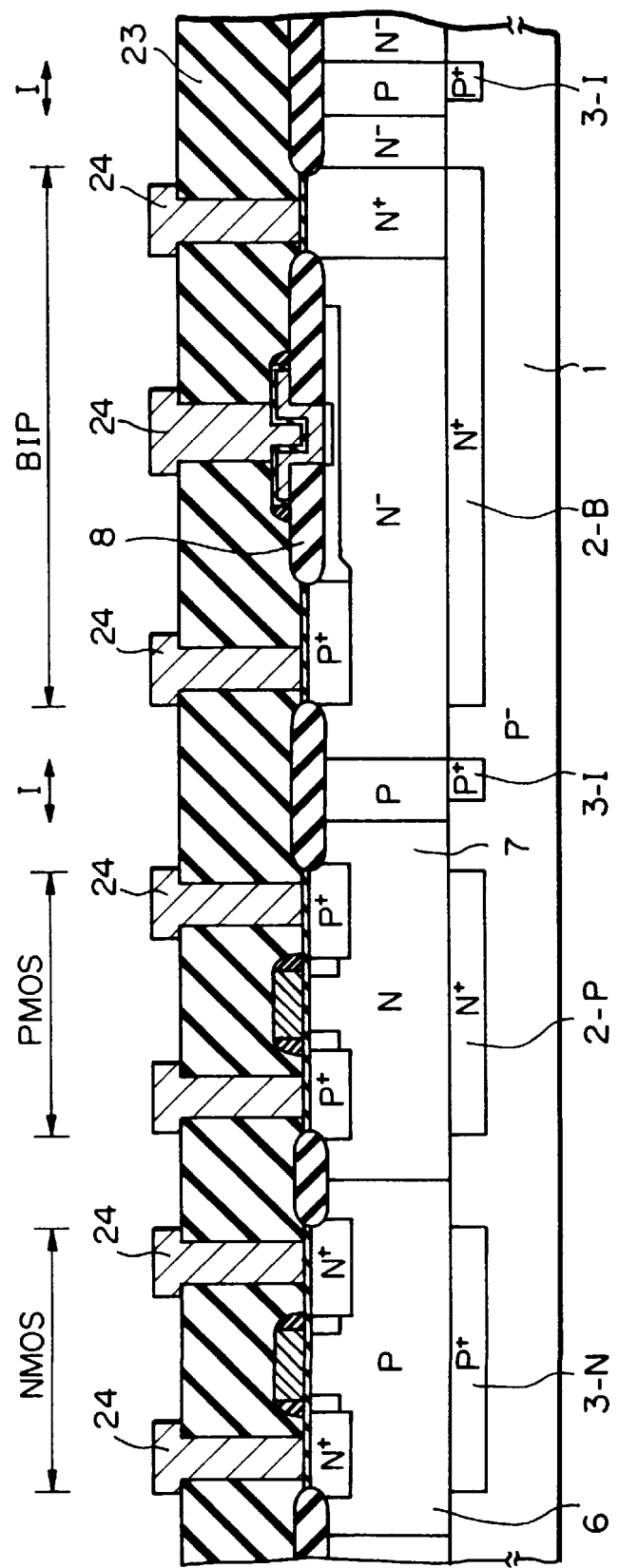

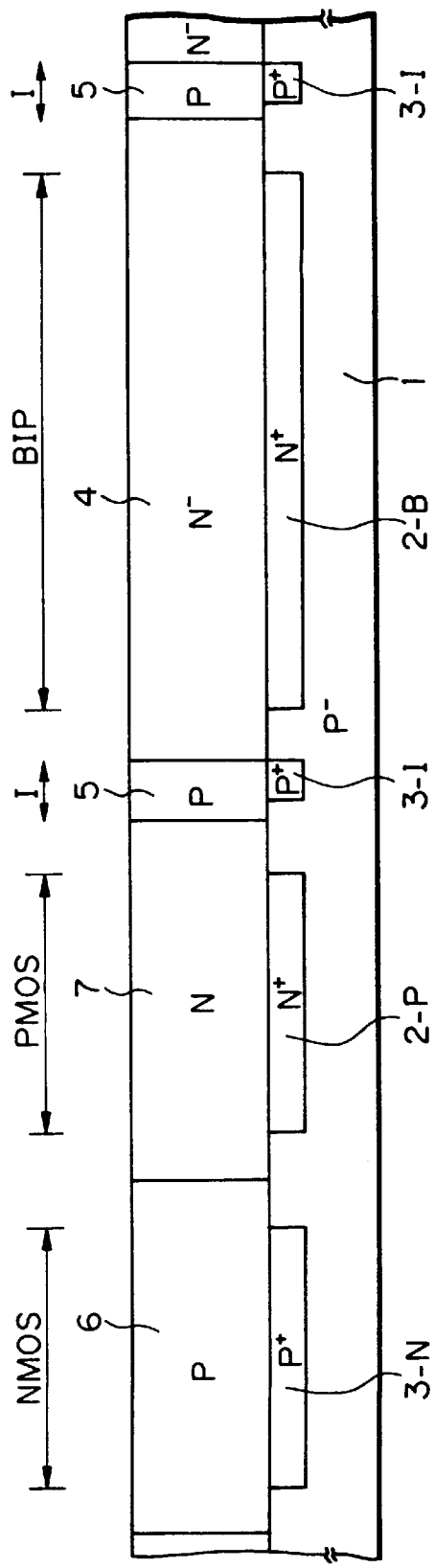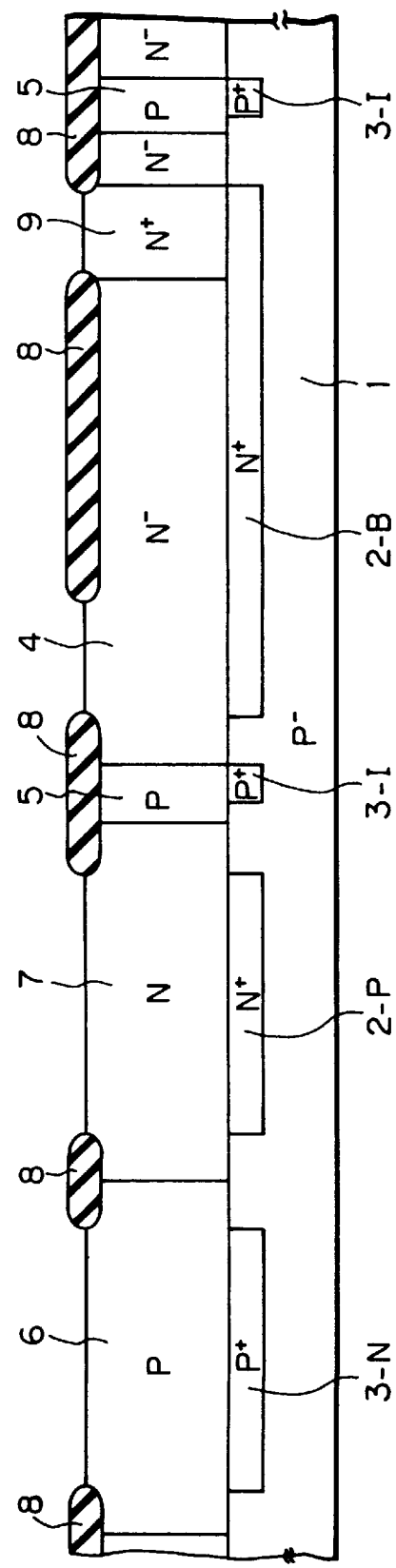

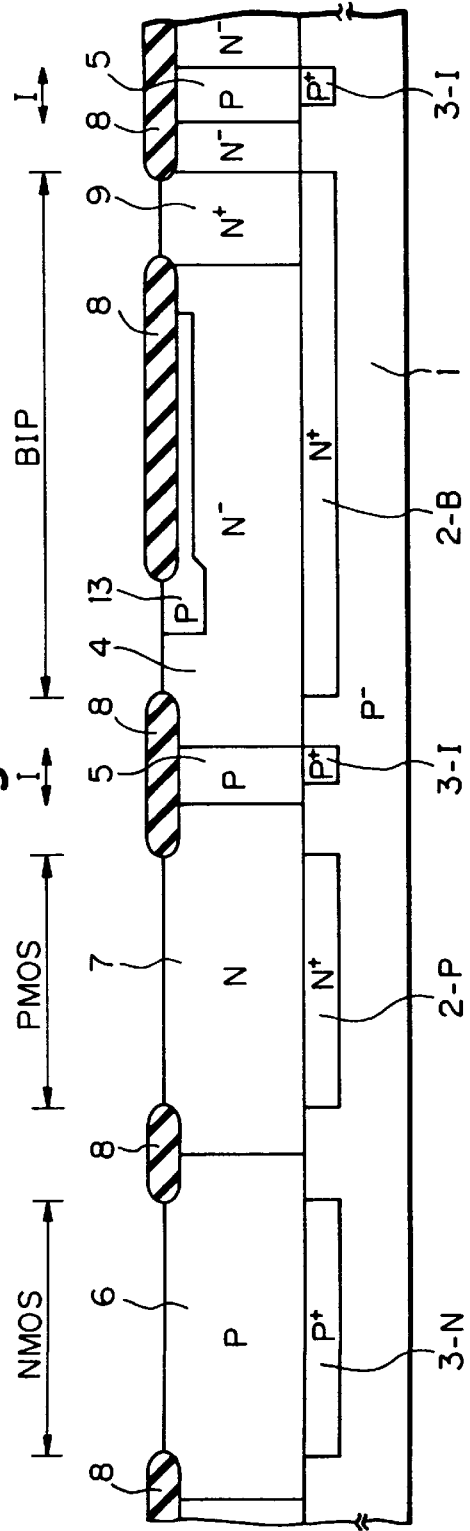
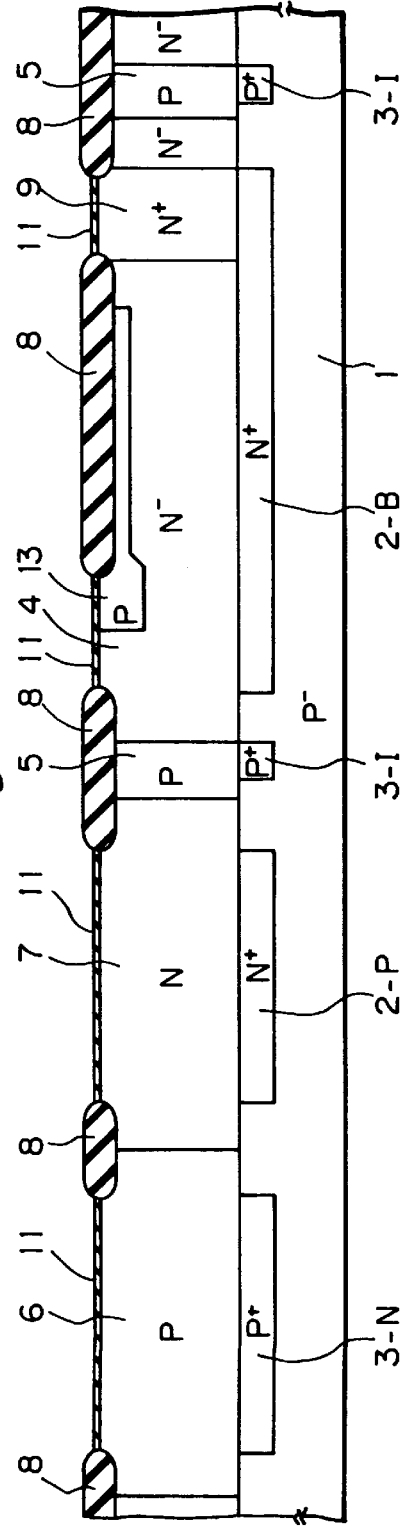

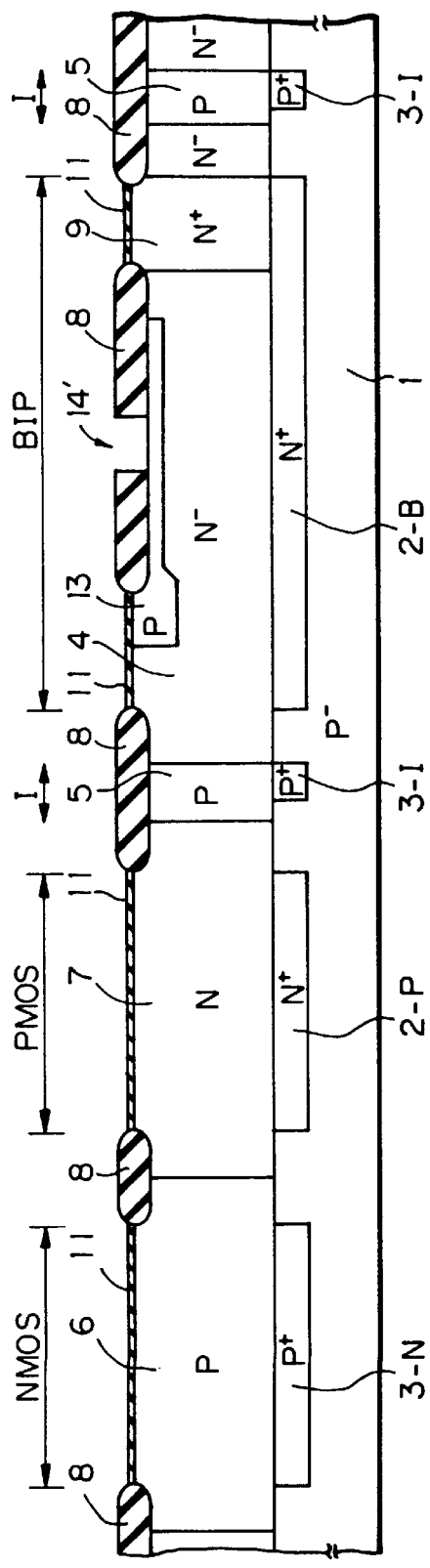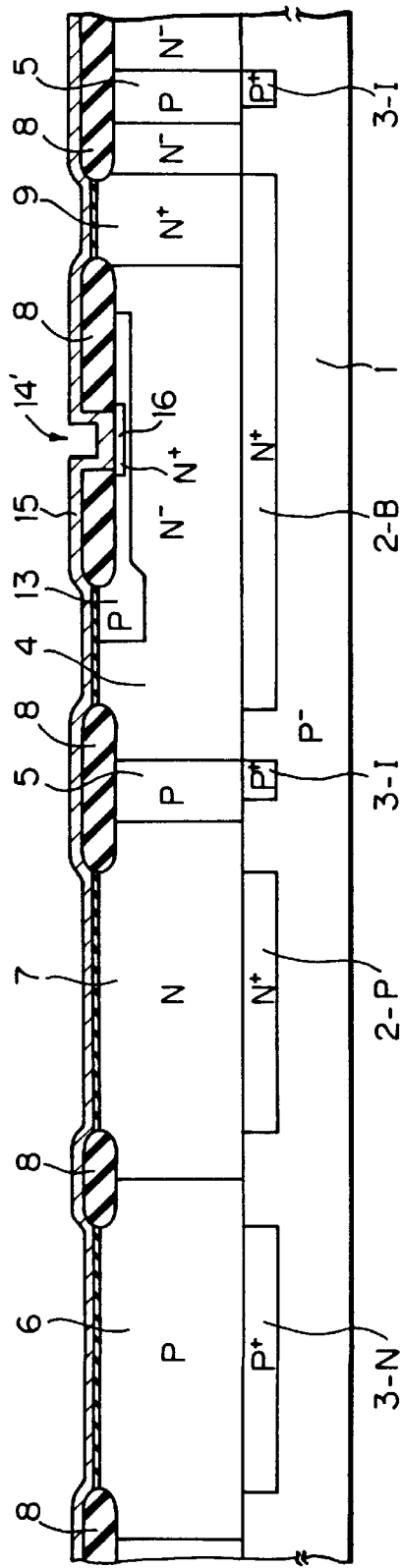

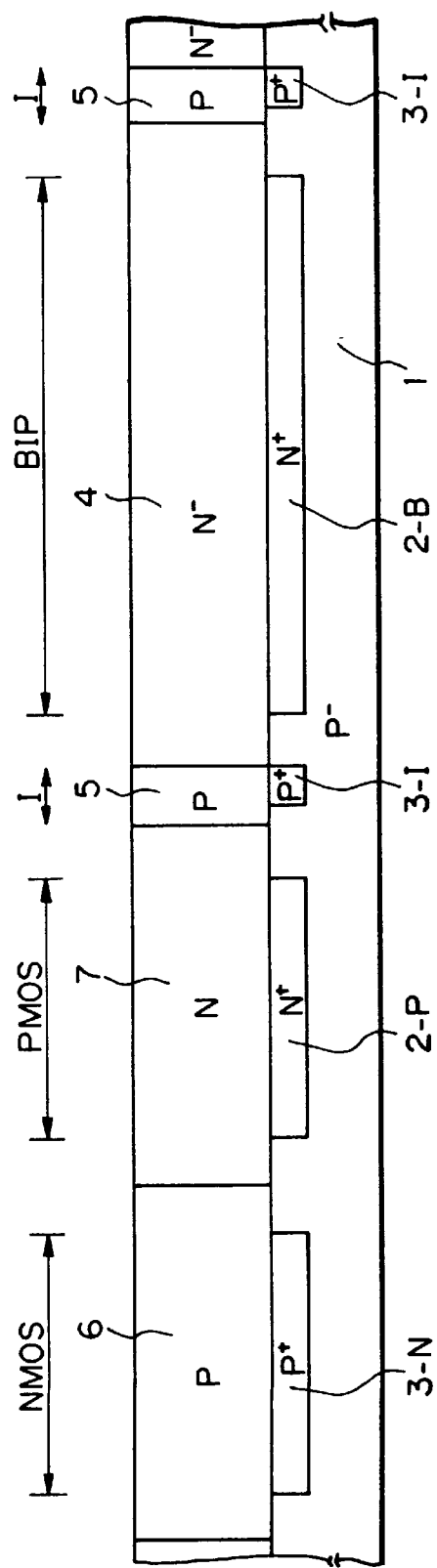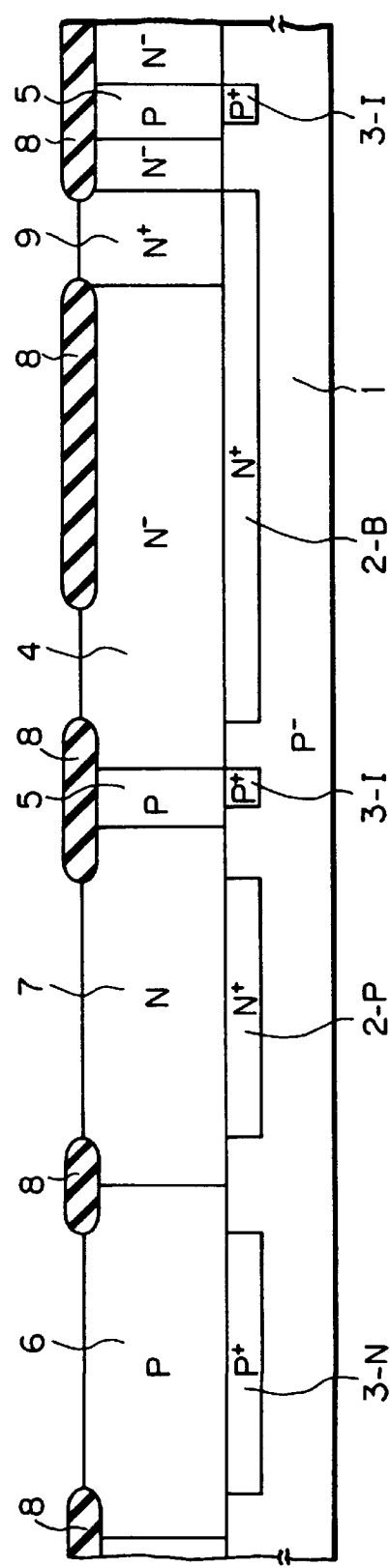

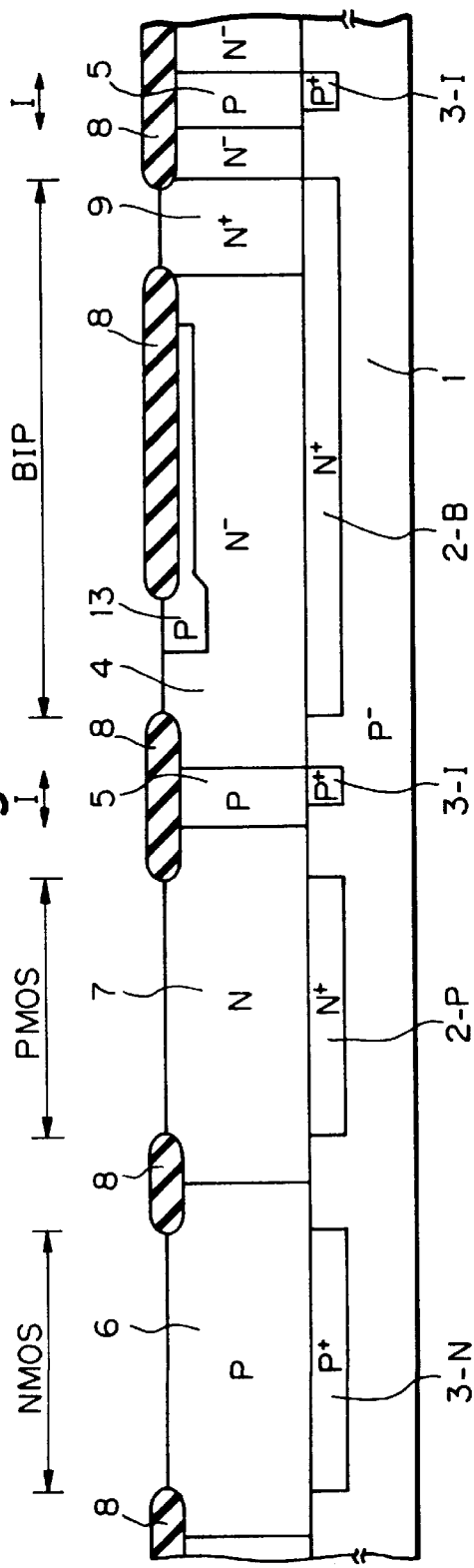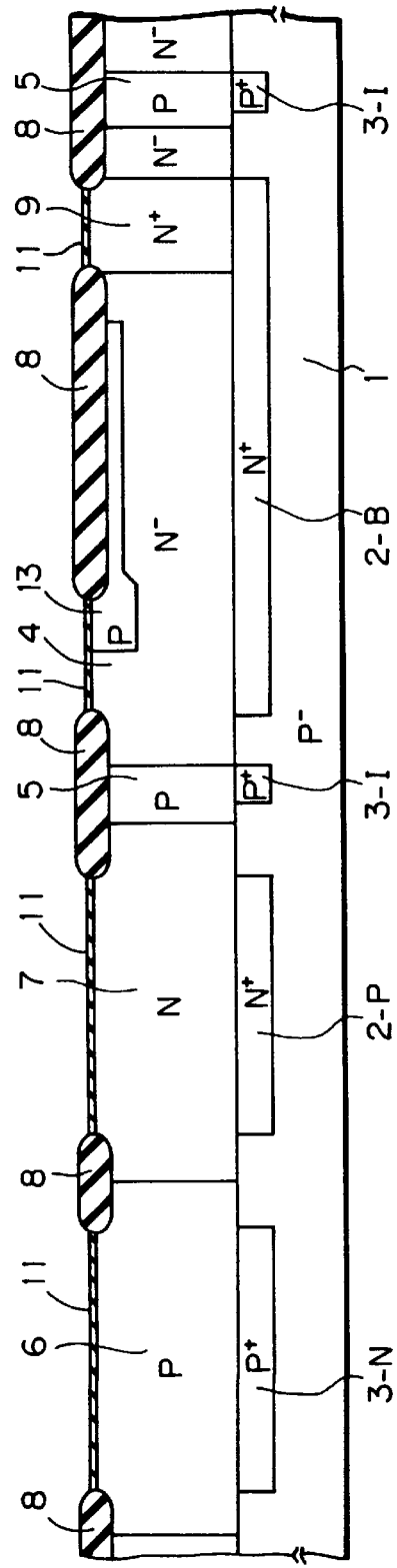

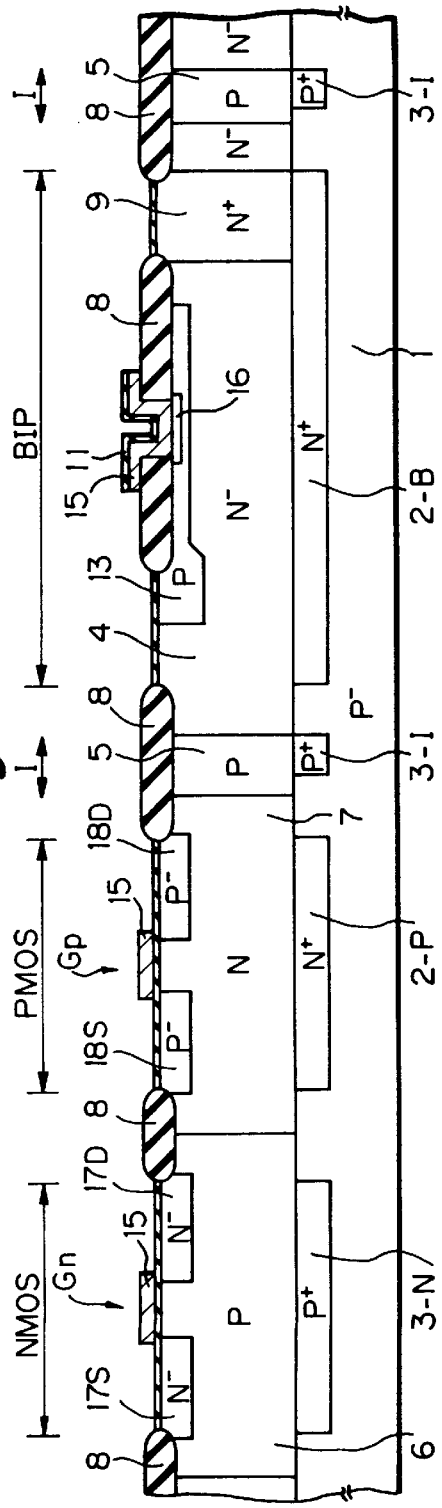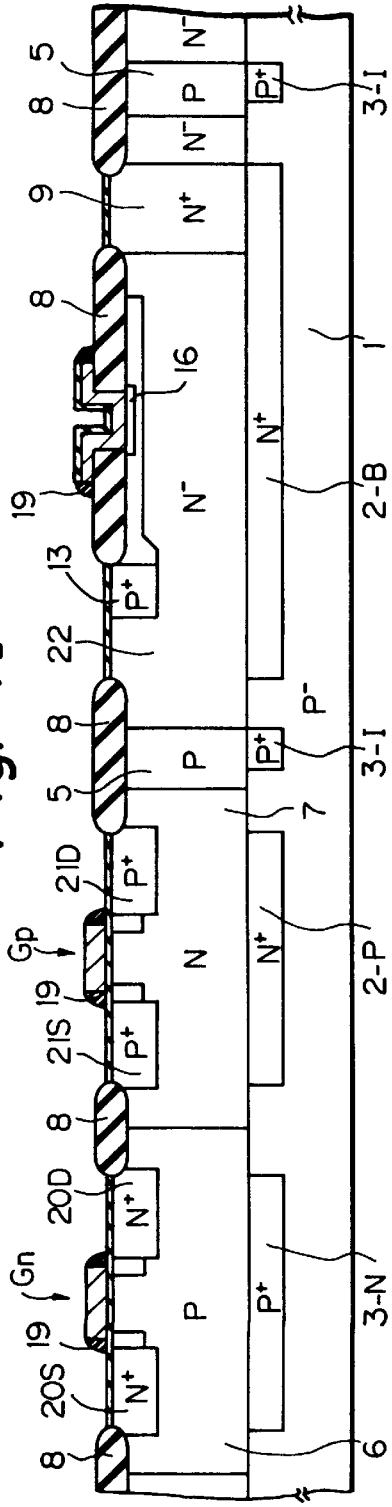

METHOD FOR MANUFACTURING BIMOS DEVICE WITH IMPROVEMENT OF HIGH FREQUENCY CHARACTERISTICS OF BIPOLAR TRANSISTOR

This is a divisional application of U.S. application Ser. No. 08/840,722, filed on Apr. 25, 1997, now issued as U.S. Pat. No. 5,933,720.

BACKGROUND OF THE INVENTION

1. Field of the Invention

The present invention relates to a method for manufacturing a BiMOS (or BiCMOS) device.

2. Description of the Related Art

In a prior art method for manufacturing a BiCMOS device (see JP-A-4-346263), a heating operation for forming an emitter region of a bipolar transistor is carried out before the formation of source/drain regions of a MOS transistor. Therefore, the total time of heating operations after the formation of the source/drain regions can be reduced, or such heating operations can be at lower temperatures. Thus, the short channel effect of the MOS transistor can be suppressed. Also, the heating operation for forming the emitter region, i.e., the base-emitter junction can be sufficiently carried out. Further, since a relatively thick insulating layer is provided between the emitter electrode and the base region of the bipolar transistor, the parasitic capacitance of the emitter electrode can be reduced to improve the high frequency characteristics. This will be explained later in detail.

In the above-described prior art method, however, the reduction of the parasitic capacitance of the emitter electrode is insufficient.

Also, the above-described prior art method requires an additional process for thermally growing the insulating layer for reducing the parasitic capacitance of the emitter electrode, thus increasing the manufacturing cost.

SUMMARY OF THE INVENTION

It is an object of the present invention to provide a method for manufacturing a BiMOS device capable of improving the high frequency characteristics of a bipolar transistor.

According to the present invention, in a method for manufacturing a BiMOS device, first and second semiconductor layers are formed on a semiconductor substrate, first and second field insulating layers are formed by using a LOCOS process on said first and second semiconductor layers, respectively. The first field insulating layer partitions a bipolar transistor area and a MOS transistor area, and the second field insulating layer is formed on a base-emitter junction region of the first semiconductor layer. Then, impurities are introduced via the second field insulating layer into the first semiconductor layer to form a base region therein. Then, an emitter opening is perforated in said second field insulating layer, and a polycrystalline silicon layer is formed on the second field insulating layer. Then, impurities of a first conductivity type are introduced into the polycrystalline silicon layer, and a heating operation is performed upon the polycrystalline silicon layer to form an emitter region. Then, the polycrystalline silicon layer is patterned to form an emitter electrode. Then, a gate insulating layer is formed on the second semiconductor layer, and a gate electrode is formed on the gate insulating layer. Finally, a base graft region is formed in the first semiconductor layer and source/drain regions are formed in the second semiconductor layer.

Also, the gate electrode can be formed simultaneously with the formation of the emitter electrode.

Further, the heating step for forming the emitter region can be carried out simultaneously with a heating step for reducing the resistance of the gate electrode under a POCL$_3$ atmosphere.

BRIEF DESCRIPTION OF THE DRAWINGS

The present invention will be more clearly understood from the description as set forth below, as compared with the prior art with reference to the accompanying drawings, wherein:

FIGS. 1A through 1I are cross-sectional views for explaining a prior art method for manucturing a BiCMOS device;

FIGS. 2A through 2J are cross-sectional views for explaining a first embodiment of the method for manufacturing a BiCMOS device according to the present invention;

FIGS. 3A through 3I are cross-sectional views for explaining a second embodiment of the method for manufacturing a BiCMOS device according to the present invention; and FIGS. 4A through 4J are cross-sectional views for explaining a third embodiment of the method for manufacturing a BiCMOS device according to the present invention.

DESCRIPTION OF THE PREFERRED EMBODIMENTS

Figure 11:
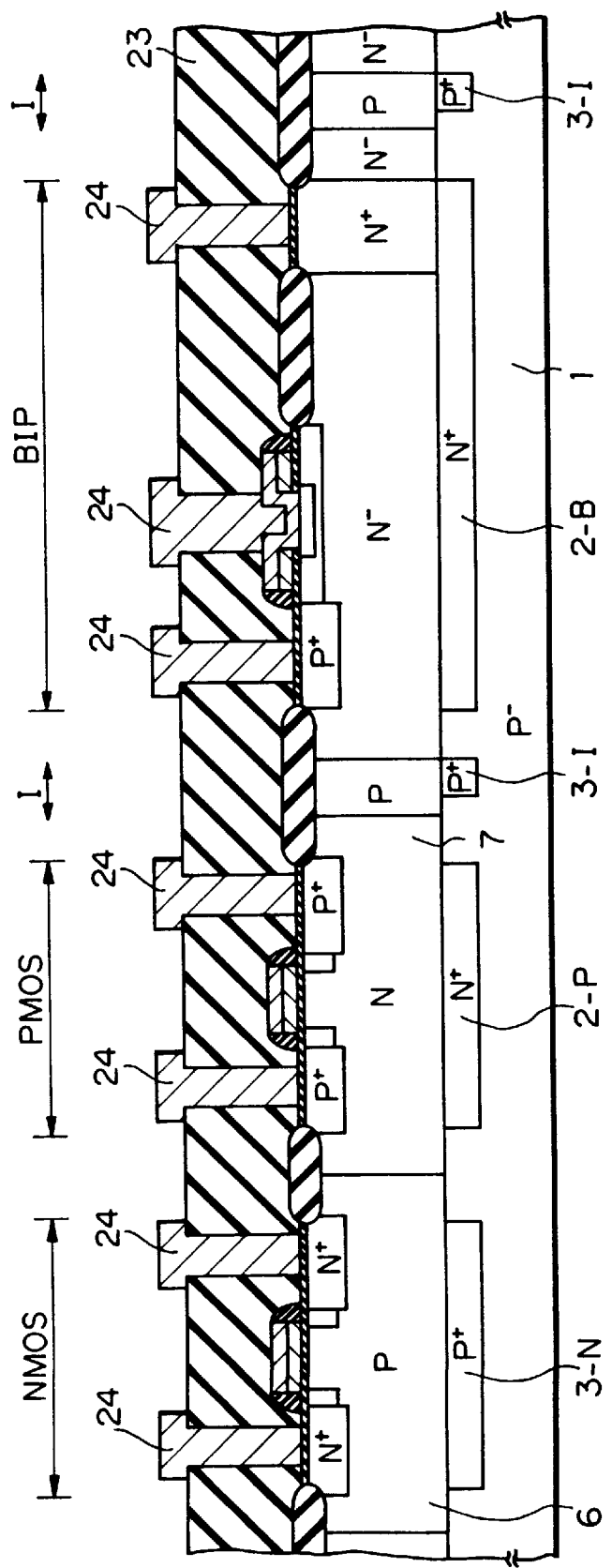

Before the description of the preferred embodiments, a prior art method for manufacturing a BiCMOS device will be explained with reference to FIGS. 1A through 1I (see JP-A-4-34626). In FIGS. 1A through 1I, NMOS designates an N-channel MOS transistor forming area, PMOS designates a P-channel MOS transistor forming area, BIP designates a bipolar transistor forming area, and I designates an isolation area.

First, referring to FIG. 1A, arsenic ions are implanted into a P$^-$-type monocrystalline silicon substrate 1 by using a photoresist pattern and a silicon oxide pattern (not shown) as a mask to form N$^+$-type buried regions 2-P and 2-B in the PMOS area and the BIP area, respectively. Then, boron ions are implanted into a P$^-$-type monocrystalline silicon substrate 1 by using a photoresist pattern and a silicon oxide pattern (not shown) as a mask to form P$^+$-type buried regions 3-N and 3-I in the NMOS area and the I area, respectively. Then, an N$^-$-type expitaxial layer 4 is grown on the entire surface, and a P-type isolation region 5, a P-type well 6 and an N-type well 7 are formed within the epitaxial layer 4 in the I area, the NMOS area and the PMOS area, respectively.

Next, referring to FIG. 1B, an about 350 nm thick field silicon oxide layer 8 is grown by a local oxidation of silicon (LOCOS) process to partition the NMOS area, the PMOS area and the BIP area. In this case, the field silicon oxide layer 8 is also formed partly on the BIP area. Then, a heating process is carried out at a temperature of about 900° C. simultaneously with doping of phosphorous ions to form an N$^+$-type collector diffusion region 9 in a collector taken-out portion of the BIP area.

Next, referring to FIG. 1C, a silicon oxide layer 10 is grown by thermally oxidizing the entire surface, and is patterned by a photolithography and etching process, so that the silicon oxide layer 10 is left only on the BIP area.

Next, referring to FIG. 1D, a gate silicon oxide layer 11 is grown by thermally oxidizing the epitaxial layer 4, the P-type well 6, the N-type well 7 and the like. Then, a polycrystalline silicon layer 12 is deposited on the entire surface by a chemical vapor deposition (CVD) process. Then, boron ions are implanted by using a photoresist pattern (not shown) as a mask into the epitaxial layer 4 to form a P-type base region 13 in the BIP area. Note that the silicon oxide layer 10 is thicker than the gate silicon oxide layer 11.

Next, referring to FIG. 1E, an emitter opening 14 is perforated in the polycrystalline silicon layer 12 and the silicon oxide layer 10 by a photolithography and etcing process.

Next, referring to FIG. 1F, a polycrystalline silicon layer 15 is deposited on the entire surface by a CVD process. Then, arsenic ions are implanted into the polycrystalline silicon layers 15 and 12. Then, a heating operation is carried out to diffuse arsenic ions from the polycrysrtalline silicon layers 15 and 12 into the base region 13. Thus, an N$^+$-type emitter region 16 is formed.

Next, referring to FIG. 1G, the polycrystalline layers 15 and 11 are patterned by a photolithography and etching process, so that a gate electrode $G_n$, a gate electrode $G_p$ and an emitter electrode E are formed in the NMOS area, the PMOS area and the BIP area, respectively. Then, phosphorous ions are implanted into the P-type well 6 by using the gate electrode $G_n$ and a photoresist pattern (not shown) to form N$^-$-type impurity (source/drain) regions 17S and 17D having a low concentration for a lightly doped drain (LDD) structure. Similarly, boron ions are implanted into the N-type well 7 by using the gate electrode $G_p$ and a photoresist pattern (not shown) to form P$^-$-type impurity (source/drain) regions 18S and 18D having a low concentration for an LDD structure.

Next, referring to FIG. 1H, a silicon oxide layer 19 is deposited on the entire surface by a CVD process. Then, the silicon oxide layer 19 is etched back by an anisotropic dry etching process, so that the silicon oxide layer 19 is left as a sidewall spacer on the sidewalls of the gate electrodes $G_n$ and $G_p$ and the emitter electrode E. Then, arsenic ions are implanted into the P-type well 6 by using the gate electrode $G_n$, its sidewall spacer 19 and a photoresist pattern (not shown) to form N$^+$-type impurity (source/drain) regions 20S and 20D having a high concentration for an LDD structure. Similarly, boron fluoride ions are implanted into the N-type well 7 by using the gate electrode $G_p$, its sidewall spacer 19 and a photoresist pattern (not shown) to form P$^+$-type impurity (source/drain) regions 21S and 21D having a high concentration for an LDD structure. In this case, a P$^+$-type base graft region 22 is simultaneously formed and is connected to the base region 13.

Finally, referring to FIG. 1I, a silicon oxide layer 23 is deposited on the entire surface by a CVD process. Then, contact holes are perforated in the silicon oxide layer 23 by a photolithography and etching process. Then, an aluminum layer 24 is deposited on the entire surface by a sputtering process, and the aluminum layer 24 is patterned. Thus, the BiCMOS device is completed.

In the prior art method as illustrated in FIGS. 1A through 1I, the heating operation for forming the emitter region 16 is carried out before the formation of the source/drain regions 17S, 17D, 18S, 18D 20S, 20D, 21S and 21D. Therefore, the short channel effect of the MOS transistors can be suppressed. Also, the heating operation for forming the emitter region 16, i.e., the base-emitter junction can be sufficiently carried out.

Further, since the silicon oxide layer 10, which is thicker than the gate silicon oxide layer 11, is provided between the emitter electrode E and the base region 13, the parasitic capacitance of the emitter electrode E can be reduced to improve the high frequency characteristics.

In the above-described prior art method, however, the reduction of the parasitic capacitance of the emitter electrode E is insufficient. That is, if the thickness of the silicon oxide layer 10 is too large, the presence of the field silicon oxide layer 8 becomes meaningless. Also, when the thick silicon oxide layer 10 is completely etched from the NMOS area and the PMOS area, the field silicon oxide layer 8 is also etched too much, so that the thickness of the field silicon oxide layer 8 becomes remarkably small or the field silicon oxide layer 8 makes stepwise. In view of tradeoff between the field silicon oxide layer 8 and the silicon oxide layer 10, the thickness of the silicon oxide layer 10 is half of that of the field silicon oxide layer 8 at most.

Also, the prior art method as illustrated in FIGS. 1A through 1I requires an additional process for thermally growing the silicon oxide layer 10, thus increasing the manufacturing cost.

Further, it has been suggested that silicon nitride used in the LOCOS process be left to reduce the parasitic capacitance of the emitter electrode E (see JP-A-4-34626). In this case, however, the high permittivity of silicon nitride cannot reduce the parasitic capacitance of the emitter electrode E sufficiently. In addition, stress caused by the thermal expansion of silicon nitride induces defects in the silicon layers, so that a leakage current flowing therethrough is increased, which also cannot reduce the parasitic capacitance of the emitter electrode E.

FIGS. 2A through 2J are cross-sectional views for explaining a first embodiment of the method for manufacturing a BiCMOS device according to the present invention.

First, referring to FIG. 2A, in the same way as in FIG. 1A, arsenic ions are implanted into a P$^-$-type monocrystalline silicon substrate 1 by using a photoresist pattern and a silicon oxide pattern (not shown) as a mask to form N$^+$-type buried regions 2-P and 2-B in the PMOS area and the BIP area, respectively. Then, boron ions are implanted into a P$^-$-type monocrystalline silicon substrate 1 by using a photoresist pattern and a silicon oxide pattern (not shown) as a mask to form P$^+$-type buried regions 3-N and 3-I in the NMOS area and the I area, respectively. Then, an N$^-$-type expitaxial layer 4 is grown on the entire surface, and a P-type isolation region 5, a P-type well 6 and an N-type well 7 are formed within the epitaxial layer 4 in the I area, the NMOS area and the PMOS area, respectively.

Next, referring to FIG. 2B, in a similar way to that of FIG. 1B, an about 350 nm thick field silicon oxide layer 8 is grown by a LOCOS process to partition the NMOS area, the PMOS area and the BIP area. In this case, the field silicon oxide layer 8 is also formed on a base forming area of the BIP area. Then, a heating process is carried out at a temperature of about 900° C. simultaneously with doping of phosphorous ions to form an N$^+$-type collector diffusion region 9 in a collector taken-out portion of the BIP area.

Next, referring to FIG. 2C, in a similar way to that of FIG. 1D, about 2×10$^{13}$ boron ions per cm$^2$ are implanted at an acceleration energy of about 100 keV by using a photoresist pattern (not shown) as a. mask into the epitaxial layer 4 to form a P-type base region 13 in the BIP area. In this case, since the base region 13 is formed after the formation of the N$^+$-type collector diffusion region 9, the base region 13 can be shallowed.

Next, referring to FIG. 2D, an emitter opening 14' is perforated in the field silicon oxide layer 8 on the base region 13 by a photolithography and etching process. In this case, since the minimum width of the emitter opening 14' is about 600 nm while the field silicon oxide layer 8 is about 350 nm thick, there is no problem in aspect ratio.

Figure 2E:
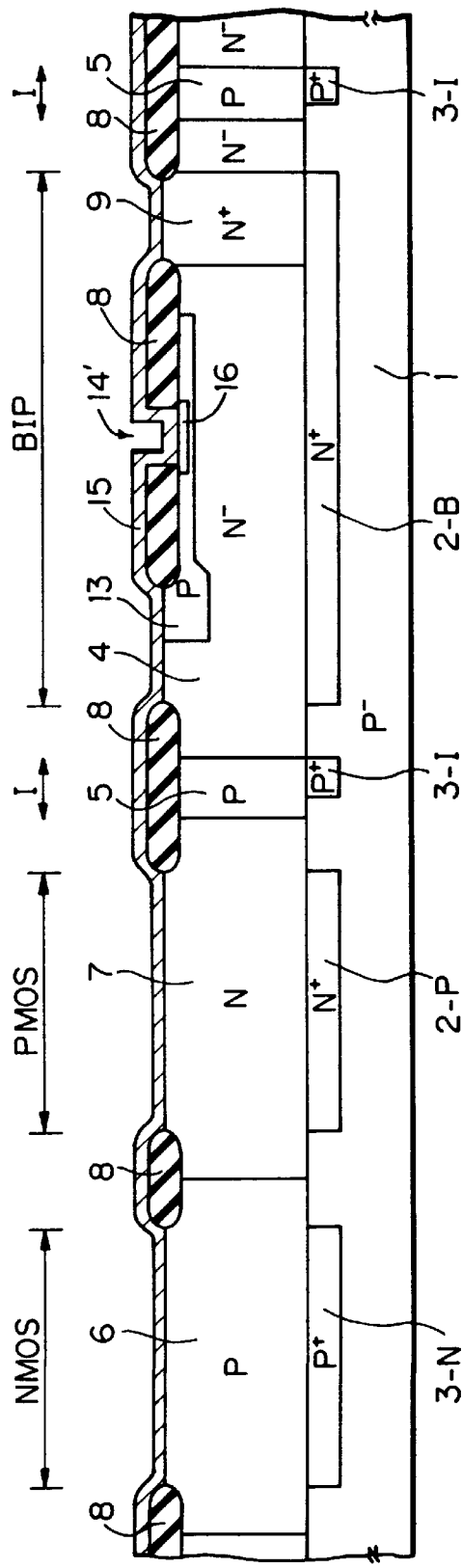

Next, referring to FIG. 2E, an about 150 to 200 nm thick polycrystalline silicon layer 15 is deposited on the entire surface by a CVD process. Then, a about $1 \times 10^{16}$ arsenic ions per cm$^2$ are implanted at an acceleration energy of about 60 to 80 keV into the polycrystalline silicon layer 15. Then, a heating operation is carried out at a temperature of about 900° C. to diffuse arsenic ions from the polycrystalline silicon layer 15 into the base region 13. Thus, an N$^+$-type emitter region 16 is formed.

Figure 2F:
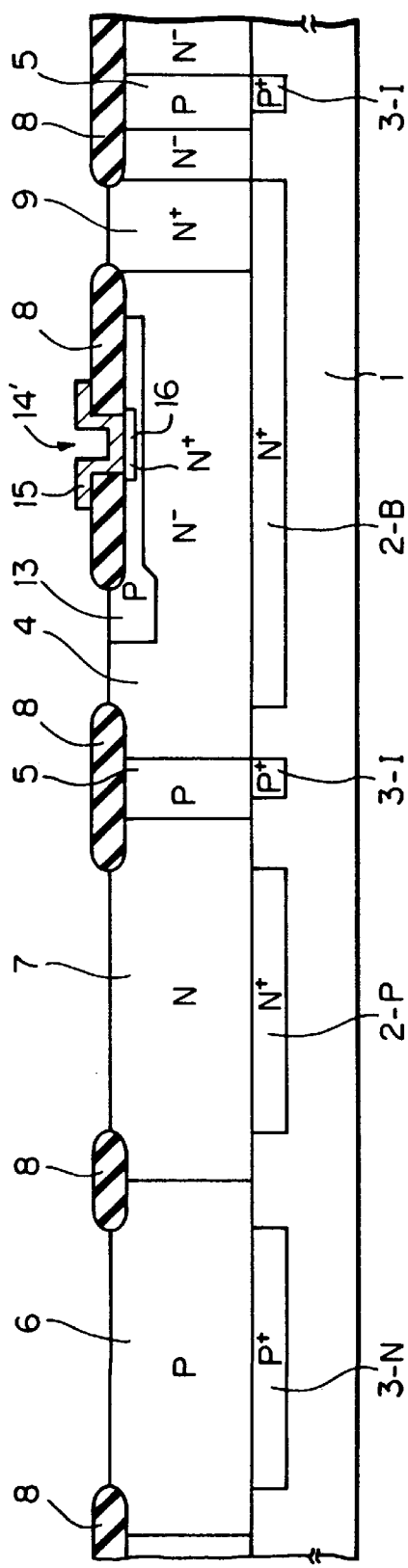

Next, referring to FIG. 2F, the polycrystalline silicon layer 15 is patterned by a photolithography and etching process, so that an emitter electrode E is formed in the BIP area.

Figure 2G:
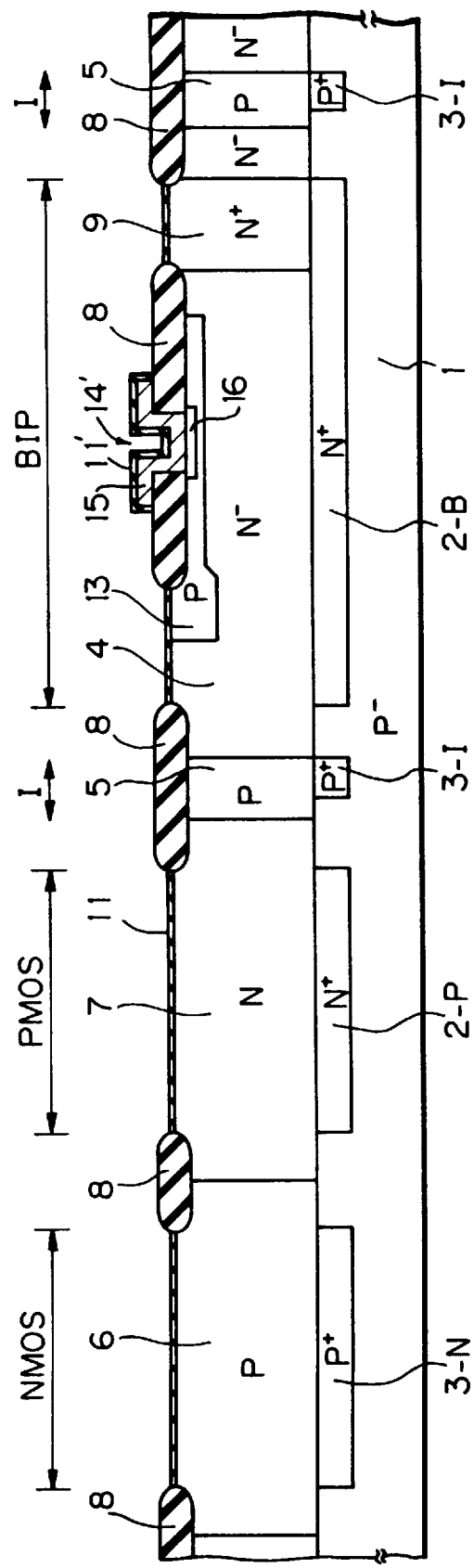

Next, referring to FIG. 2G, an about 5 to 10 nm thick gate silicon oxide layer 11 is grown by thermally oxidizing the epitaxial layer 4, the P-type well 6, the N-type well 7 and the like. In this case, the polycrystalline silicon layer 15 is also simultaneously oxidized to form a silicon oxide layer 11'.

Figure 2H:
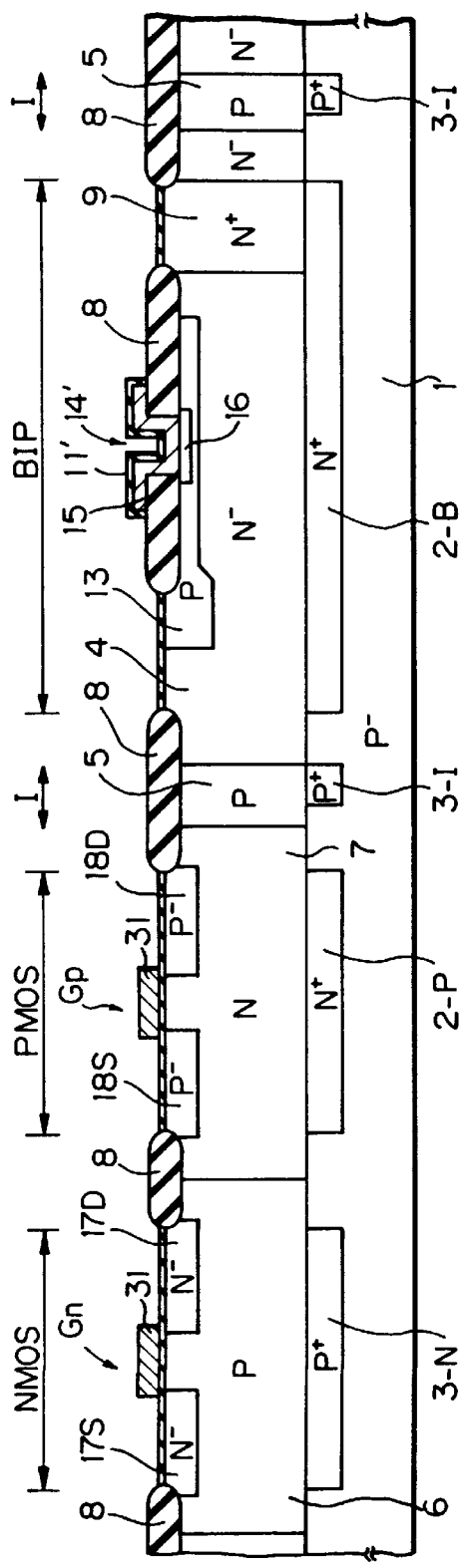

Next, referring to FIG. 2H, an about 200 to 400 nm thick polycrystalline silicon layer 21 is deposited on the entire surface by a CVD process. Then, a heating process is carried out under a POCl$_3$ gas atmosphere to reduce the resistance of the polycrystalline silicon layer 31. Also, a phosphosilicated glass (PSG) layer (not shown) is deposited on the entire surface. Then, the PSG layer 32 is removed by a wet etching process, and the polycrystalline silicon layer 31 are patterned by a photolithography and etching process, so that a gate electrode G$_n$ and a gate electrode G$_p$ are formed in the NMOS area and the PMOS area. Then, about $1 \times 10^{13}$ to $5 \times 10^{13}$ phosphorous ions per cm$^2$ are implanted at an acceleration energy of 10 to 30 keV into the P-type well 6 by using gate electrode G$_n$ and a photoresist pattern (not shown) to form N$^-$-type impurity (source/drain) regions 17S and 17D having a low concentration for an LDD structure. Similarly, about $1 \times 10^{13}$ to $3 \times 10^3$ boron ions per cm$^2$ are implanted at an acceleration energy of about 10 to 30 keV into the N-type well 7 by using gate electrode G$_p$ and a photoresist pattern (not shown) to form P$^-$-type impurity (source/drain) regions 18S and 18D having a low concentration for an LDD structure.

Figure 2I:
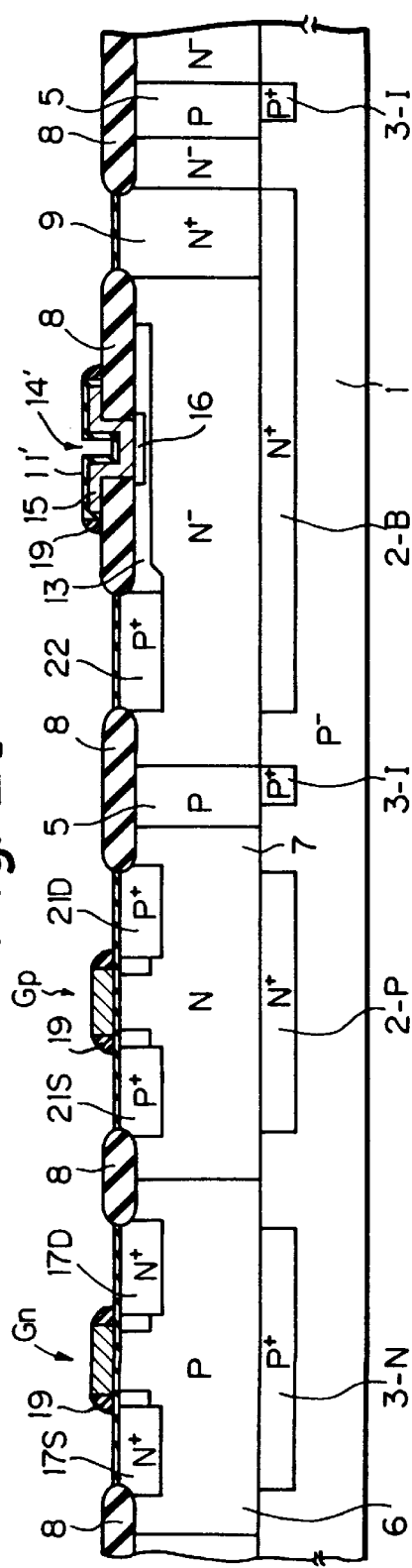

Next, referring to FIG. 2I, an about 100 nm thick silicon oxide layer 19 is deposited on the entire surface by a CVD process. Then, the silicon oxide layer 19 is etched back by an anisotropic dry etching process, so that the silicon oxide layer 19 is left as a sidewall spacer on the sidewalls of the gate electrodes G$_n$ and G$_p$ and the emitter electrode E. In this case, since the base-emitter junction of the BIP area is completed, the base-emitter junction can be protected against the anistropic etching operation. Then, about $1 \times 10^{15}$ to $5 \times 10^{15}$ arsenic ions per cm are implanted at an acceleration energy of about 30 to 50 keV into the P-type well 6 by using gate electrode G$_n$, its sidewall spacer 19 and a photoresist pattern (not shown) to form N$^+$-type impurity (source/drain) regions 20S and 20D having a high concentration for an LDD structure. Similarly, about $1 \times 10^{15}$ to $5 \times 10^{15}$ boron fluoride ions per cm$^2$ are implanted at an acceleration energy of about 30 to 50 keV into the N-type well 7 by using the gate electrode G$_p$, its sidewall spacer 19 and a photoresist pattern (not shown) to form P$^+$-type impurity (source/drain) regions 21S and 21D having a high concentration for an LDD structure. In this case, a P$^+$-type base graft region 22 is simultaneously formed and is connected to the base region 13.

Finally, referring to FIG. 2J, an about 100 nm thick silicon oxide layer 23 is deposited on the entire surfacre by a CVD process. Then, contact holes are perforated in the silicon oxide layer 23 by a photolithography and etching process. Then, an aluminum layer 24 is deposited on the entire surface by a sputtering process, and the aluminum layer 24 is patterned. Thus, the BiCMOS device is completed.

In the first embodiment as illustrated in FIGS. 2A through 2J, since the field silicon oxide layer 8, which is thicker than the gate silicon oxide layer 10 of the prior art, is provided between the emitter electrode E and the base region 13, the parasitic capacitance of the emitter electrode E can be further reduced to improve the high frequency characteristics.

Although the silicon oxide layer 10 of the prior art requires an additional thermal growing process, the field silicon oxide layer 8 between the emitter electrode E and the base region 13 does not require an additional thermal growing process, thus reducing the manufacturing cost.

FIGS. 3A through 3I are cross-sectional views for explaining a second embodiment of the method for manufacturing a BiCMOS device according to the present invention.

First, referring to FIG. 3A, in the same way as in FIG. 2A, arsenic ions are implanted into a P$^-$-type monocrystalline silicon substrate 1 by using a photoresist pattern and a silicon oxide pattern (not shown) as a mask to form N$^+$-type buried regions 2-P and 2-B in the PMOS area and the BIP area, respectively. Then, boron ions are implanted into a P$^-$-type monocrystalline silicon substrate 1 by using a photoresist pattern and a silicon oxide pattern (not shown) as a mask to form P$^+$-type buried regions 3-N and 3-I in the NMOS area and the I area, respectively. Then, an N$^-$-type expitaxial layer 4 is grown on the entire surface, and a P-type isolation region 5, a P-type well 6 and N-type well 7 are formed within the epitaxial layer 4 in the I area, the NMOS area and the PMOS area, respectively.

Next, referring to FIG. 3B, in the same way as in FIG. 2B, an about 350 nm thick field silicon oxide layer 8 is grown by a LOCOS process to partition the NMOS area, the PMOS area and the BIP area. In this case, the field silicon oxide layer 8 is also formed on a base forming area of the BIP area. Then, a heating process is carried out at a temperature of about 900° C. simultaneously with doping of phosphorous ions to form an N$^+$-type collector diffusion region 9 in a collector taken-out portion of the BIP area.

Next, referring to FIG. 3C, in the same way as in FIG. 2C, about $2 \times 10^{13}$ boron ions per cm$^2$ are implanted at an acceleration energy of about 100 keV by using a photoresist pattern (not shown) as a mask into the epitaxial layer 4 to form a P-type base region 13 in the BIP area. In this case, since the base region 13 is formed after the formation of the N$^+$-type collector diffusion region 9, the base region 13 can be shallowed.

Next, referring to FIG. 3D, in the same way as in FIG. 2G, an about 5 to 10 nm thick gate silicon oxide layer 11 is grown by thermally oxidizing the epitaxial layer 4, the P-type well 6, the N-type well 7 and the like.

Next, referring to FIG. 3E, in the same way as in FIG. 2D, an emitter opening 14' is perforated in the field silicon oxide layer 8 on the base region 13 by a photolithography and etching process.

Next, referring to FIG. 3F, in the same way as in FIG. 2E, an about 150 to 200 nm thick polycrystalline silicon layer 15 is deposited on the entire surface by a CVD process. Then, about $1 \times 10^{16}$ arsenic ions per cm$^2$ are implanted at an acceleration energy of about 60 to 80 keV into the polycrystalline silicon layer 15. Then, a heating operation is carried out at a temperature of about 900° C. to diffuse arsenic ions from the polycrystalline silicon layer 15 into the base region 13. Thus, an N$^+$-type emitter region 16 is formed.

Figure 3G:
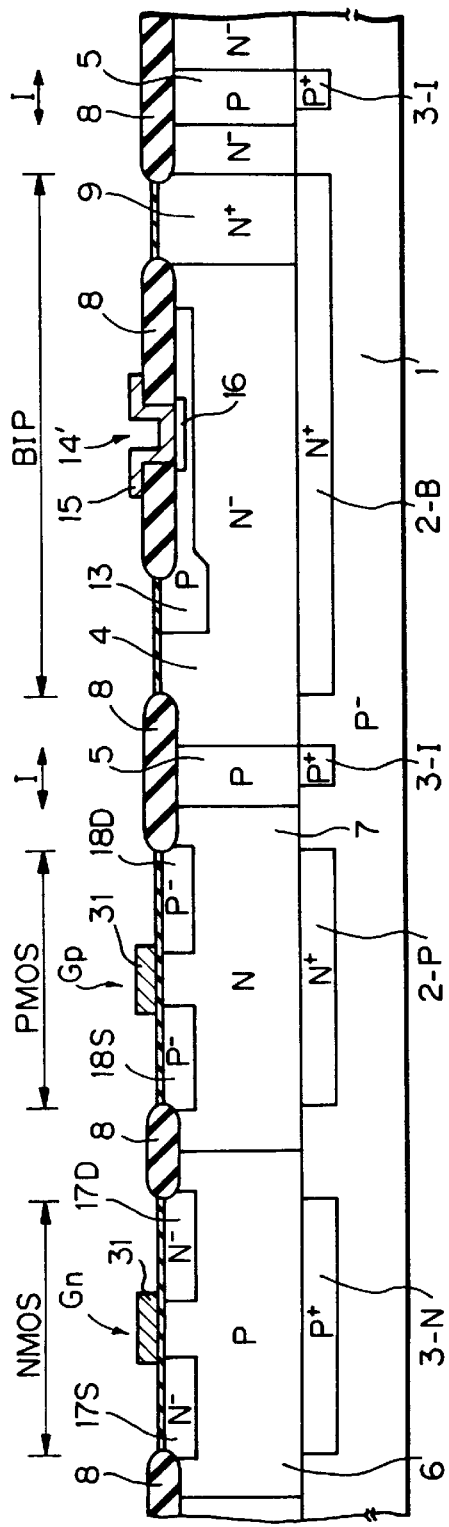

Next, referring to FIG. 3G, the polycrystalline silicon layer 15 is patterned by a photolithography and etching process, so that a gate electrode G$_n$, a gate electrode G$_p$ and an emitter electrode E are, formed in the NMOS area, the PMOS area and the BIP area, respectively. Then, about $1\times10^{13}$ to $5\times10^{13}$ phosphorous ions per cm$^2$ are implanted at an acceleration energy of 10 to 30 keV into the P-type well 6 by using the gate electrode G$_n$ and a photoresist pattern (not shown) to form N$^-$-type impurity (source/drain) regions 17S and 17D having a low concentration for an LDD structure. Similarly, about $1\times10^{13}$ to $3\times10^3$ boron ions per cm$^2$ are implanted at an acceleration energy of about 10 to 30 keV into the N-type well 7 by using the gate electrode G$_p$ and a photoresist pattern (not shown) to form P$^-$-type impurity (source/drain) regions 18S and 18D having a low concentration for an LDD structure.

Figure 3H:
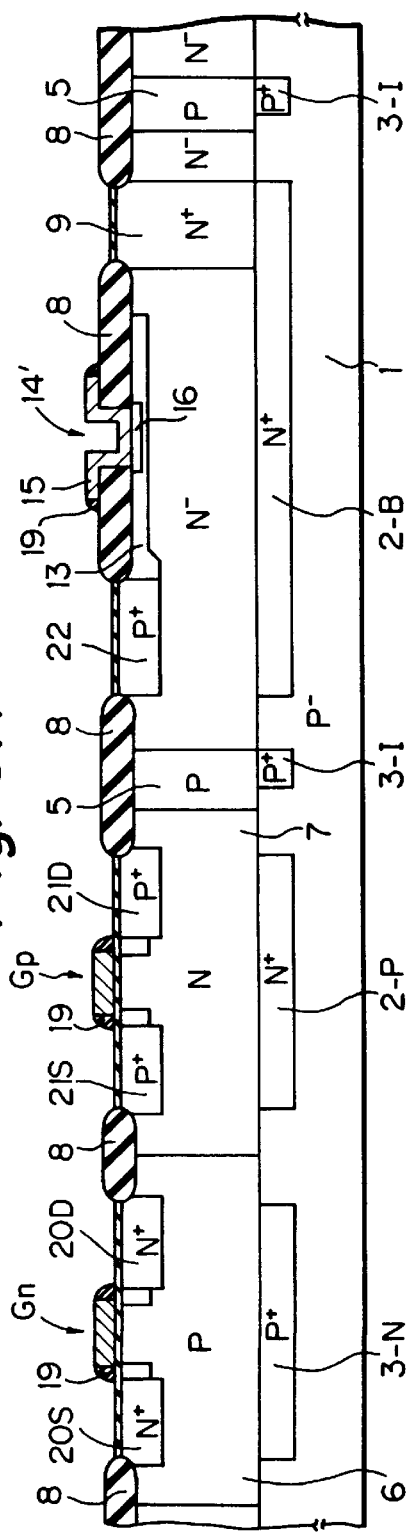

Next, referring to FIG. 3H, in the same way as in FIG. 2I, an about 100 nm thick silicon oxide layer 19 is deposited on the entire surface by a CVD process. Then, the silicon oxide layer 19 is etched back by an anisotropic dry etching process, so that the silicon oxide layer 19 is left as a sidewall spacer on the sidewalls of the gate electrodes G$_n$ and G$_p$ and the emitter electrode E. Then, about $1\times10^{15}$ to $5\times10^{15}$ arsenic ions per cm$^2$ are implanted at an acceleration energy of about 30 to 50 keV into the P-type well 6 by using the gate electrode G$_n$, its sidewall spacer 19 and a photoresist pattern (not shown) to form N$^+$-type impurity (source/drain) regions 20S and 20D having a high concentration for an LDD structure. Similarly, about $1\times10^{15}$ to $5\times10^{15}$ boron fluoride ions per cm$^2$ are implanted at an acceleration energy of about 30 to 50 keV into the N-type well 7 by using the gate electrode G$_p$, its sidewall spacer 19 and a photoresist pattern (not shown) to form P$^+$-type impurity (source/drain) regions 21S and 21D having a high concentration for an LDD structure. In this case, a P$^+$-type base graft region 22 is simultaneously formed and is connected to the base region 13.

Figure 3I:
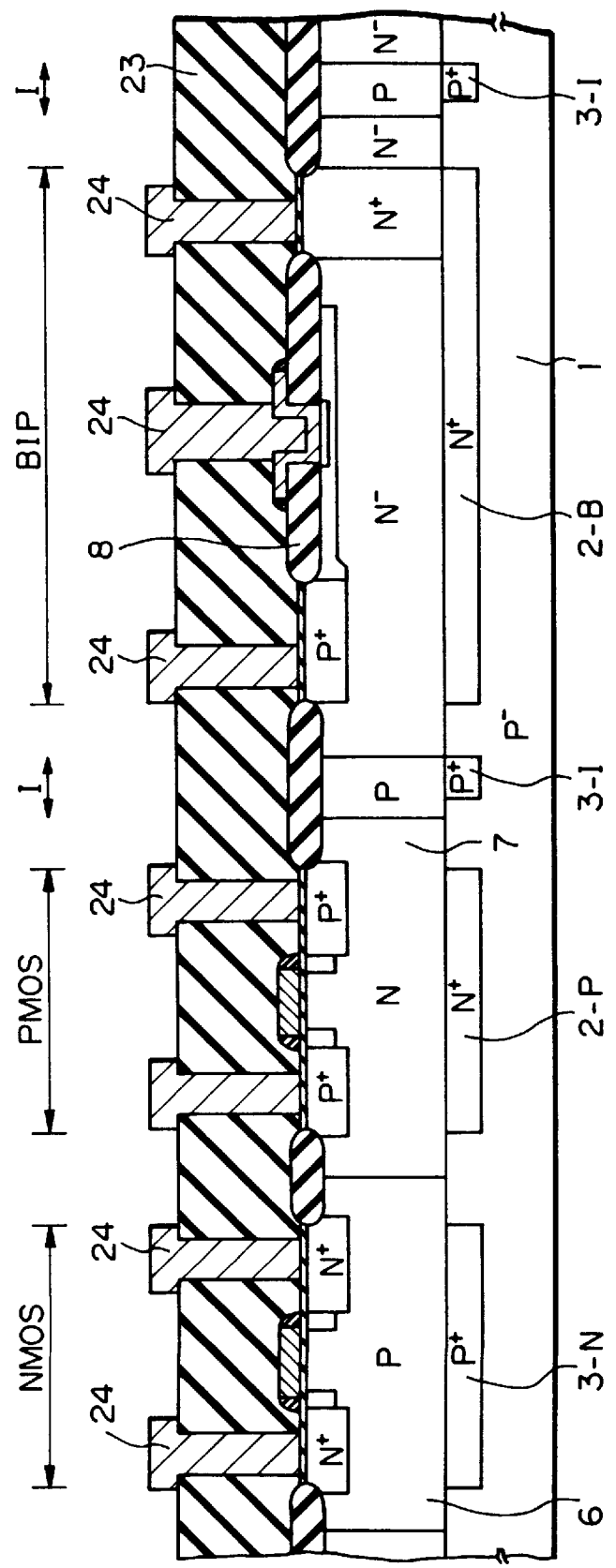

Finally, referring to FIG. 3I, in the same way as in FIG. 2J, an about 100 nm thick silicon oxide layer 23 is deposited on the entire surface by a CVD process. Then, contact holes are perforated in the silicon oxide layer 23 by a photolithography and etching process. Then, an aluminum layer 24 is deposited on the entire surface by a sputtering process, and the aluminum layer 24 is patterned. Thus, the BiCMOS device is completed.

In the first embodiment, the emitter electrode E and the gate electrodes G$_n$ and G$_p$ are formed by using different polycrystalline silicon layers. On the other hand, in the second embodiment, the emitter electrode E and the gate electrodes G$_p$ and G$_n$ are formed by the same polycrystalline silicon layer. Therefore, the second embodiment is advantageous over the first embodiment in terms of the manufacturing cost.

FIGS. 4A through 4J are cross-sectional views for explaining a third embodiment of the method for manufacturing a BiCMOS device according to the present invention.

First, referring to FIG. 4A, in the same way as in FIG. 3A, arsenic ions are implanted into a P$^-$-type monocrystalline silicon substrate 1 by using a photoresist pattern and a silicon oxide pattern (not shown) as a mask to form N$^+$-type buried regions 2-P and 2-B in the PMOS area and the BIP area, respectively. Then, boron ions are implanted into a P$^-$-type monocrystalline silicon substrate 1 by using a photoresist pattern and a silicon oxide pattern (not shown) as a mask to form P$^+$-type buried regions 3-N and 3-I in the NMOS area and the I area, respectively. Then, an N$^-$-type expitaxial layer 4 is grown on the entire surface, and a P-type isolation region 5, a P-type well and an N-type well 7 are formed within the epitaxial layer 4 in the I area, the NMOS area and the PMOS area, respectively.

Next, referring to FIG. 4B, in the same way as in FIG. 3B, an about 350 nm thick field silicon oxide layer 8 is grown by a LOCOS process to partition the NMOS area, the PMOS area and the BIP area. In this case, the field silicon oxide layer 8 is also formed on a base forming area of the BIP area. Then, a heating process is carried out at a temperature of about 900° C. simultaneously with doping of phosphorous ions to form an N$^+$-type collector diffusion region 9 in a collector taken-out portion of the BIP area.

Next, referring to FIG. 4C, in the same way as in FIG. 3C, about $2\times10^{13}$ boron ions per cm$^2$ are implanted at an acceleration energy of about 100 keV by using a photoresist pattern (not shown) as a mask into the epitaxial layer 4 to form a P-type base region 13 in the BIP area.

Next, referring to FIG. 4D, in the same way as in FIG. 3D, an about 5 to 10 nm thick gate silicon oxide layer 11 is grown by thermally oxidizing the epitaxial layer 4, the P-type well 6, the N-type well 7 and the like.

Figure 4E:
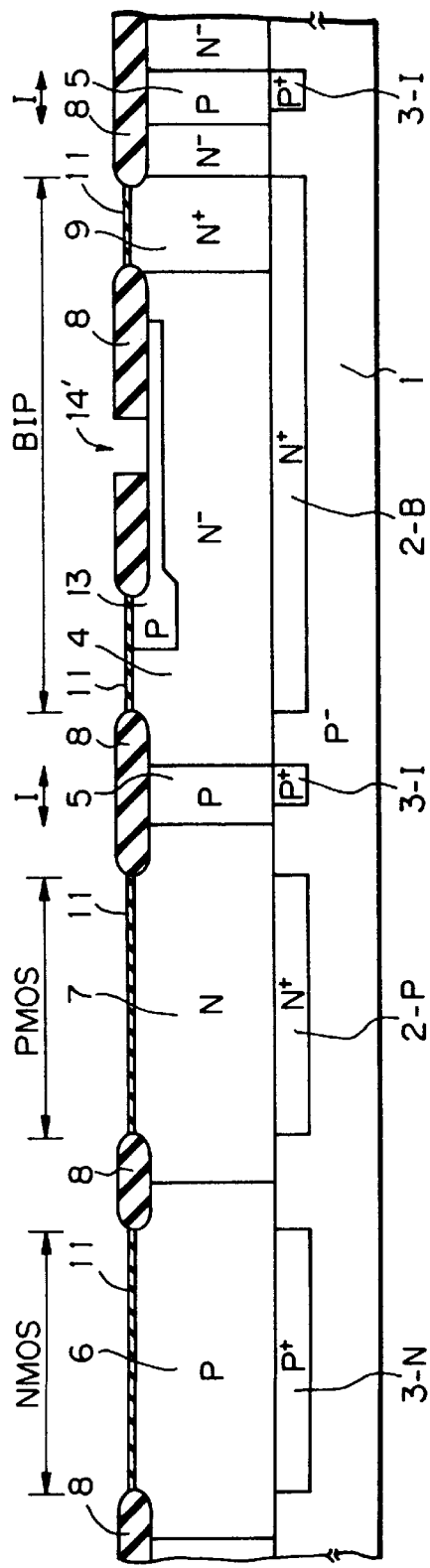

Next, referring to FIG. 4E, in the same way as in FIG. 3E, an emitter opening 14' is perforated in the field silicon oxide layer 8 on the base region 13 by a photolithography and etching process.

Figure 4F:
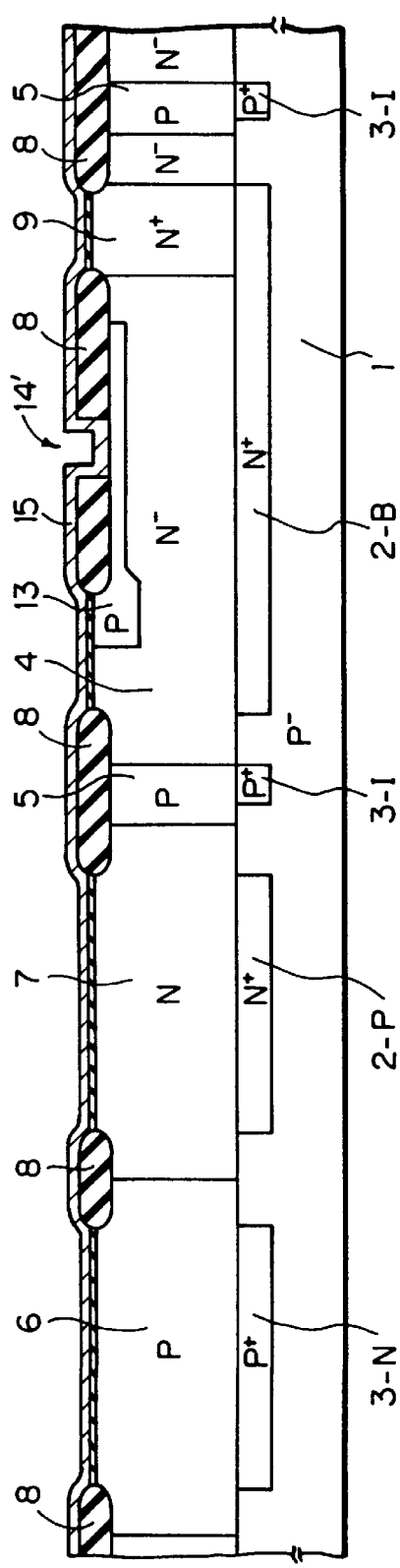

Next, referring to FIG. 4F, in a similar way to that of FIG. 3F, an about 150 to 200 nm thick polycrystalline silicon layer 15 is deposited on the entire surface by a CVD process. Then, about $1\times10^{16}$ arsenic ions per cm$^2$ are implanted at an acceleration energy of about 60 to 80 keV into the polycrystalline silicon layer 15.

Figure 4G:
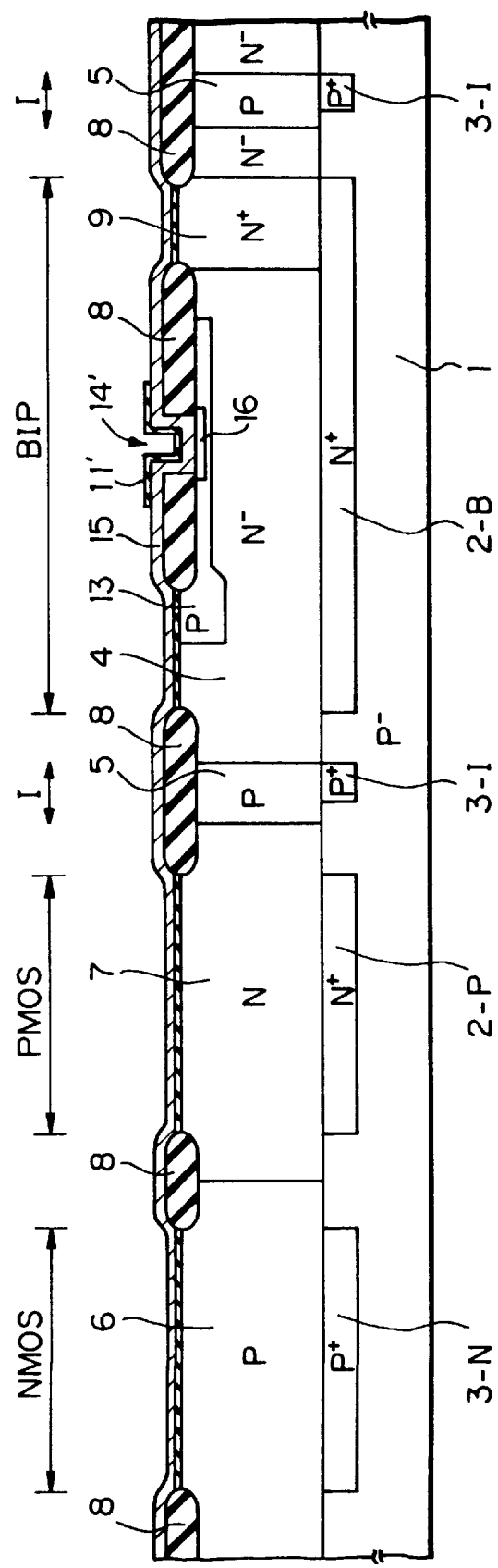

Next, referring to FIG. 4G, a silicon oxide layer 11' is thermally grown on the polycrystalline silicon layer 15. Then, the silicon oxide layer 11' is patterned by a photolithography and etching process, so that the silicon oxide layer 11" is left on the emitter opening 14' and its periphery. Then, a heating process is carried out under a POCl$_3$ gas atmosphere to reduce the resistance of the polycrystalline silicon layer 15. In this case, an emitter region 16 is also formed.

Next, referring to FIG. 4H, a PSG layer (not shown) is deposited on the entire surface. Then, the PSG layer is removed by a wet etching process, and the polycrystalline silicon layer 15 are patterned by a photolithography and etching process, so that a gate electrode G$_n$ and a gate electrode G$_p$ are formed in the NMOS area and the PMOS area, respectively. Then, an about $1\times10^{13}$ to $5\times10^{13}$ phosphorous ions per cm$^2$ are implanted at an acceleration energy of 10 to 30 keV into the P-type well 6 by using gate electrode G$_n$ and a photoresist pattern (not shown) to form N$^-$-type impurity (source/drain) regions 17S and 17D having a low concentration for an LDD structure. Similarly, an about $1\times10^{13}$ to $3\times10^3$ boron ions per cm$^2$ are implanted at an acceleration energy of about 10 to 30 keV into the N-type well 7 by using the gate electrode G$_p$ and a photoresist pattern (not shown) to form P$^-$-type impurity (source/drain) regions 18S and 18D having a low concentration for an LDD structure.

Next, referring to FIG. 4I, in the same way as in FIG. 3H, an about 100 nm thick silicon oxide layer 19 is deposited on the entire surface by a CVD process. Then, the silicon oxide layer 19 is etched back by an anisotropic dry etching process, so that the silicon oxide layer 19 is left as a sidewall spacer on the sidewalls of the gate electrodes $G_n$ and $G_p$ and the emitter electrode E. Then, about $1\times10^{15}$ to $5\times10^{15}$ arsenic ions per cm$^2$ are implanted at an acceleration energy of about 30 to 50 keV into the P-type well 6 by using the gate electrode $G_n$, its sidewall spacer 19 and a photoresist pattern (not shown) to form N$^+$-type impurity (source/drain) regions 20S and 20D having a high concentration for an LDD structure. Similarly, about $1\times10^{15}$ to $5\times10^{15}$ boron fluoride ions per cm$^2$ are implanted at an acceleration energy of about 30 to 50 keV into the N-type well 7 by using the gate electrode $G_p$, its sidewall spacer 19 and a photoresist pattern (not shown) to form P$^+$-type impurity (source/drain) regions 21S and 21D having a high concentration for an LDD structure. In this case, a P$^+$-type base graft region 22 is simultaneously formed and is connected to the base region 13.

Figure 4J:
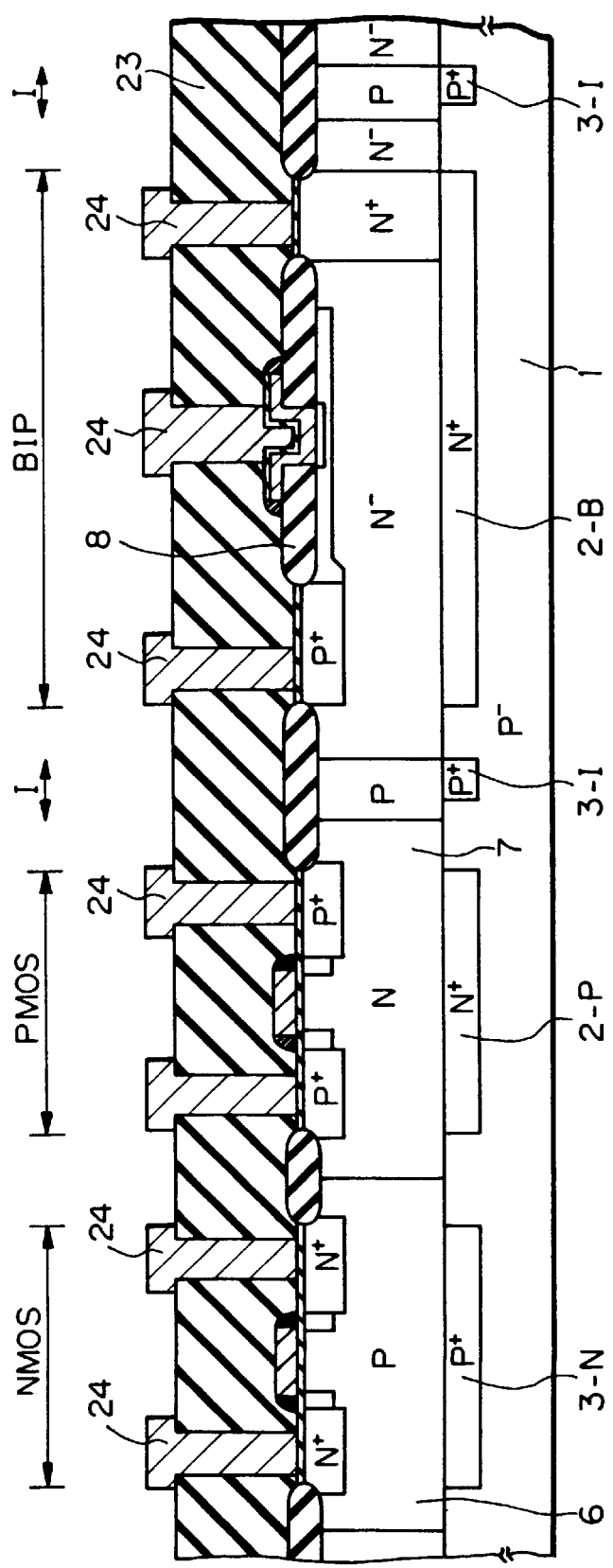

Finally, referring to FIG. 4J, in the same way as in FIG. 3I, an about 100 nm thick silicon oxide layer 23 is deposited on the entire surface by a CVD process. Then, contact holes are perforated in the silicon oxide layer 23 by a photolithography and etching process. Then, an aluminum layer 24 is deposited on the entire surface by a sputtering process, and the aluminum layer 24 is patterned. Thus, the BiCMOS device is completed.

In the third embodiment, the emitter region 16 is formed by a heating process under a POCl$_3$ gas atmosphere for reducing the resistance of the gate electrodes $G_n$ and $G_p$.

In the above-described embodiments, the gate electrode $G_n$ and $G_p$ can be made of polycide formed by polycrystalline silicon and refractory metal silicide such as tungsten silicide or titanium silicide.

The present invention can be applied to a static random access memory (SRAM) device. Also, when the first embodiment is applied to an SRAM device, the emitter region can be formed simultaneously with the formation of a contact structure (direct contact structure) between a gate and an N$^+$-type impurity diffusion region. Further, when the second embodiment is applied to a SRAM device, the emitter electrode can be made of polycide from which a ground wiring layer of memory cells is also made.

As explained hereinabove, according to the present invention, since a thick field insulating layer is provided between the emitter electrode and the base region, the parasitic capacitance of the emitter electrode can be remarkably reduced to improve the high frequency characteristics. Also, the field insulating layer does not require additional processes, thus reducing the manufacturing cost.

What is claimed is:

1. A method for manufacturing a BiMOS device, comprising the steps of:

forming first and second semiconductor layers on a semiconductor substrate, said first semiconductor layer being of a first conductivity type and defining a bipolar transistor area, said second semiconductor layer defining a MOS transistor, said semiconductor substrate having a second conductivity type different from said first conductivity type;

forming first and second field insulating layers by using a LOCOS process on said first and second semiconductor layers, respectively, said first field insulating layer partitioning said bipolar transistor area and said MOS transistor area, said second field insulating layer being formed on a base-emitter junction region of said first semiconductor layer;

introducing impurities of said second conductivity type via said second field insulating layer into said first semiconductor layer to form a base region therein;

perforating an emitter opening in said second field insulating layer;

forming a polycrystalline silicon layer on said second field insulating layer after said emitter opening is perforated;

introducing impurities of said first conductivity type into said polycrystalline silicon layer;

performing a heating operation upon said polycrystalline silicon layer to diffuse the impurities from said polycrystalline silicon layer via said emitter opening to said base region to form an emitter region;

patterning said polycrystalline silicon layer to form an emitter electrode after said emitter region is formed;

forming a gate insulating layer on said second semiconductor layer after said emitter electrode is formed;

forming a gate electrode on said gate insulating layer; and forming a base graft region of said second conductivity type in said first semiconductor layer and source/drain regions in said second semiconductor layer after said gate electrode is formed.

2. A method for manufacturing a BiMOS device, comprising the steps of:

forming first and second semiconductor layers on a semiconductor substrate, said first semiconductor layer being of a first conductivity type and defining a bipolar transistor area, said second semiconductor layer defining a MOS transistor, said semiconductor substrate having a second conductivity type different from said first conductivity type;

forming first and second field insulating layers by using a LOCOS process on said first and second semiconductor layers, respectively, said first field insulating layer partitioning said bipolar transistor area and said MOS transistor, said second field insulating layer being formed on a base-emitter junction region of said first semiconductor layer;

forming a gate insulating layer on said first and second semiconductor layers after said first and second field insulating layers are formed;

perforating an emitter opening in said second field insulating layer after said base region is formed;

forming a polycrystalline silicon layer on said second field insulating layer after said emitter opening is perforated;

introducing impurities of said first conductivity type into said polycrystalline silicon layer;

performing a heating operation upon said polycrystalline silicon layer to diffuse the impurities from said polycrystalline silicon layer via said emitter opening to said base region to form an emitter region;

patterning said polycrystalline silicon layer to form an emitter electrode on said first semiconductor layer and a gate electrode on said second semiconductor layer after said emitter region is formed; and forming a base graft region of said second conductivity type in said first semiconductor layer and source/drain regions in said second semiconductor layer after said emitter electrode and said gate electrode are formed.

3. A method for manufacturing a BiMOS device, comprising the steps of:

forming first and second semiconductor layers on a semiconductor substrate, said first semiconductor layer being of a first conductivity type and defining a bipolar transistor area, said second semiconductor layer defining a MOS transistor, said semiconductor substrate having a second conductivity type different from said first conductivity type;

forming first and second field insulating layers by using a LOCOS process on said first and second semiconductor layer, respectively, said first field insulating layer partitioning said bipolar transistor area and said MOS transistor, said second field insulating layer being formed on a base-emitter junction region of said first semiconductor layer;

forming a gate insulating layer on said first and second semiconductor layers after said first and second field insulating layers are formed;

introducing impurities of said second conductivity type via said second field insulating layer into said first semiconductor layer to form a base region therein after said gate insulating layer is formed;

perforating an emitter opening in said second field insulating layer after said base region is formed;

forming a polycrystalline silicon layer on said second field insulating layer after said emitter opening is perforated;

introducing impurities of said first conductivity type into said polycrystalline silicon layer above said emitter opening after the impurities of said first conductivity are introduced into said polycrystalline silicon layer;

performing a heating operation under a $POCl_3$ atmosphere upon said polycrystalline silicon layer to diffuse the impurities from said polycrystalline silicon layer via said emitter opening to said base region to form an emitter region after said insulating pattern layer is formed;

patterning said polycrystalline silicon layer to form an emitter electrode on said first semiconductor layer and a gate electrode on said second semiconductor layer after said emitter region is formed; and forming a base graft region of said second conductivity type in said first semiconductor layer and source/drain regions in said second semiconductor layer after said emitter electrode and said gate electrode are formed.

* * * * *